United States Patent
Lopez et al.

(10) Patent No.: US 11,533,206 B2
(45) Date of Patent: Dec. 20, 2022

(54) METHOD, TRANSMITTER, STRUCTURE, TRANSCEIVER AND ACCESS POINT FOR PROVISION OF MULTI-CARRIER ON-OFF KEYING SIGNAL

(71) Applicant: Telefonaktiebolaget LM Ericsson (publ), Stockholm (SE)

(72) Inventors: Miguel Lopez, Solna (SE); Leif Wilhelmsson, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 17/285,311

(22) PCT Filed: Oct. 15, 2018

(86) PCT No.: PCT/EP2018/078065
§ 371 (c)(1),
(2) Date: Apr. 14, 2021

(87) PCT Pub. No.: WO2020/078530
PCT Pub. Date: Apr. 23, 2020

(65) Prior Publication Data
US 2021/0351964 A1 Nov. 11, 2021

(51) Int. Cl.
*H04L 27/04* (2006.01)
*H03M 5/12* (2006.01)
*H04L 5/00* (2006.01)

(52) U.S. Cl.
CPC .............. *H04L 27/04* (2013.01); *H03M 5/12* (2013.01); *H04L 5/0007* (2013.01)

(58) Field of Classification Search
CPC ......... H04L 27/04; H04L 5/0007; H03M 5/12
See application file for complete search history.

(56) References Cited

U.S. PATENT DOCUMENTS

| | | | | |
|---|---|---|---|---|
| 2007/0142009 A1* | 6/2007 | Scarpa | ............... | H04B 7/0871 455/132 |
| 2008/0117995 A1* | 5/2008 | Anderson | ........... | H04L 25/0234 375/260 |

(Continued)

FOREIGN PATENT DOCUMENTS

| | | |
|---|---|---|
| JP | 2020520583 A | 7/2020 |
| WO | 2018098471 A1 | 5/2018 |
| WO | 2018186648 A1 | 10/2018 |

OTHER PUBLICATIONS

Shellhammer, Steve, et al., "Proposed Draft WUR PHY Specification", IEEE P802.11-18/0152r5, Qualcomm, Jan. 17, 2018, 1-15.

(Continued)

*Primary Examiner* — Janice N Tieu
(74) *Attorney, Agent, or Firm* — Murphy, Bilak & Homiller, PLLC

(57) ABSTRACT

A method and transmitter for transmitting an On-Off Keying, OOK, signal which comprises an ON waveform and an OFF waveform forming a pattern representing transmitted binary information as a Manchester code. For one binary value of information to be transmitted, a first set of complex-valued frequency domain symbols is provided to an inverse fast Fourier transformer, or for the other binary value of information to be transmitted, a second set of complex-valued frequency domain symbols is provided to the inverse fast Fourier transformer. The inverse fast Fourier transform is performed to form an orthogonal frequency division multiplex, OFDM, representation, including a cyclic prefix, of the OOK signal of information to be transmitted. The OFDM representation is then transmitted.

26 Claims, 11 Drawing Sheets

(56) References Cited

U.S. PATENT DOCUMENTS

| | | | |
|---|---|---|---|
| 2008/0266014 A1 | 10/2008 | Ma et al. | |
| 2018/0227070 A1 | 8/2018 | Suh et al. | |
| 2018/0263058 A1* | 9/2018 | Yang | H04W 74/0825 |
| 2020/0127756 A1* | 4/2020 | Iwai | H04J 13/22 |

OTHER PUBLICATIONS

Wilhelmsson, Leif, et al., "Partial OOK—Generalizing the Blank GI Idea", IEEE 802.11-17/1673r1, Ericsson AB, Nov. 6, 2017, 1-25.
Alphan, Sahin, et al., "IEEE802.11-17/1419r0", OOK Waveform Coding Scheme for Frequency Domain Multiplexing, Submission, Sep. 11, 2017, 1-15.
Shellhammer, Steve, et al., "IEEE P802.1 1-18/1567r2", IEEE P802.11 Wireless LANs, Spec Text on MC-OOK Symbol Randomization, Sep. 11, 2018, 1-9.
Sundman, Dennis, et al., "Partial On-Off Keying—A Simple Means to Further Improve IoT Performance", 2018 Global Internet of Things Summit (GIoTS), 2018, 1-5.
Wilhelmsson, Leif R., et al., "Spectrum efficient support of Wake-Up Receivers by Using (O)FDMA", 2018 IEEE Wireless Communications and Networking Conference (WCNC), 2018, 1-6.

* cited by examiner

First and last 0.8 μs of an OFDM symbol are equal due to CP insertion

METHOD, TRANSMITTER, STRUCTURE, TRANSCEIVER AND ACCESS POINT FOR PROVISION OF MULTI-CARRIER ON-OFF KEYING SIGNAL

TECHNICAL FIELD

The present disclosure generally relates to an approach for transmitting an On-Off Keying, OOK, signal. In particular, the disclosure relates to low-complexity implementation of providing and transmitting such a signal.

BACKGROUND

Wake-up receivers (WUR), sometimes also referred to as wake-up radios, provide a means to significantly reduce the power consumption in receivers used in wireless communication. The idea with a WUR is that it can be based on a very relaxed architecture, as it only needs to be able to detect the presence of a wake-up signal, but will not be used for any data reception.

A commonly used modulation for the wake-up packet (WUP), i.e., the signal sent to the WUR, is on-off keying (OOK). OOK is a binary modulation, where a logical one is represented with sending a signal (ON) whereas a logical zero is represented by not sending a signal (OFF). In the 802.11 draft specification IEEE 802.11-18/0152r5 of Jan. 17, 2018, with title "Proposed Draft WUR PHY Specification", the WUP is called WUR PPDU (Physical Protocol Data Unit).

There are currently activities ongoing in the IEEE 802.11 task group (TG) named IEEE 802.11ba to standardize the PHY and MAC layer for a Wake-Up Radio to be used as a companion radio to the 802.11 primary communications radio (PCR) with the mere purpose to significantly reduce the power consumption.

OOK is a binary modulation, where a logical one is represented with sending a signal (ON) whereas a logical zero is represented by not sending a signal (OFF). Here, one of the states may represent one binary symbol value and the other state will then represent the other binary symbol. Patterns of the states may represent a binary symbol, e.g. as provided through Manchester coding.

FIG. 1 illustrates the WUR and PCR, e.g. for IEEE 802.11 communication, share the same antenna. When the WUR is turned on and waiting for the wake-up message, the IEEE 802.11 chipset can be switched off to preserve energy. Once the wake-up message is received by the WUR, the WUR wakes up the PCR and starts e.g. Wi-Fi communication with an access point (AP).

FIG. 2 schematically illustrates a traditional structure for OOK generation. The signal to be transmitted, e.g. the bits for the WUP, is for example Manchester coded in a Manchester-based encoder 200. The encoded signal controls which output signal to provide during a next symbol time, $T_{sym}$, e.g. by a switch arrangement 202. $T_{sym}$ may for example be 2 µs for a high data rate or it may be 4 µs for a low data rate. The switching is made between a signal provided by an ON signal waveform generator 204, which in the present approach provides a multicarrier signal mimicking the desired ON signal, and a signal provided by an OFF signal waveform generator 206, which in the present approach provides a zero signal. The switching arrangement 202 outputs a signal sequence to be transmitted, which is traditionally processed and wirelessly transmitted.

The multicarrier signal referred to above is normally generated by means of an inverse fast Fourier transform (IFFT), as this block may already be available in some transmitters such as for example Wi-Fi transmitters supporting e.g. IEEE 802.11a/g/n/ac. FIG. 3 schematically illustrates a structure for generating a basic baseband waveform using IFFT. An example approach for generating the multicarrier signal to represent a WUP is to use 13 sub-carriers in the centre of an OFDM multicarrier signal, and populating these 13 sub-carriers with a signal to represent ON and to not transmit anything at all to represent OFF. This may be referred to as multicarrier OOK (MC-OOK).

In one example, the IFFT has 64 points and is operating at a sampling rate of 20 MHz, and just as for ordinary orthogonal frequency division multiplexing (OFDM) a cyclic prefix (CP) is added after the IFFT operation in order to have the OFDM symbol duration as being used in IEEE 802.11a/g/n/ac. In some examples of MC-OOK for a WUP, the same OFDM symbol is used. In other words, the same frequency domain symbols are used to populate the non-zero subcarriers for all data symbols.

In IEEE 802.11-18/0152r5 with the title "Proposed Draft WUR PHY Specification" mentioned above, it is proposed to apply Manchester coding to the information bits of the WUP. That is, for example a logical "0" is encoded as "10" and a logical "1" as "01". Therefore, every data symbol comprises an "ON" part (where there is energy) and an "OFF" part, where there is no energy. An important feature of MC-OOK is that the same OFDM symbol is used to generate MC-OOK. In other words, the same frequency domain symbols are used to populate the non-zero subcarriers for all data symbols. Using the same OFDM symbol to generate the "ON" part of every Manchester coded data symbol has some advantages. For example, it allows coherent reception of the MC-OOK. Moreover, the generation of ON waveform can be inclined to have low peak to average power ratio and/or can be inclined for performance.

The PHY proposed in IEEE 802.11-18/0152r5 defines two data rates, called Low Data Rate (LDR) and High Data Rate (HDR). Manchester coding is applied to the data part of the WUP for both data rates. That is, a logical "0" is encoded as "10" and a logical "1" as "01". Therefore, every data symbol comprises an "ON" part (where there is energy) and an "OFF" part, where there is no energy. Furthermore, the low data rate employs a repetition code. Specifically, an approach discussed for generating the OOK is to use the 13 sub-carriers in the centre, and then populating these with some signal to represent ON and to not transmit anything at all to represent OFF. FIG. 4 is a block diagram schematically illustrating a transmitter enabling the approach discussed above, where a 64 point IFFT provides an inverse-transformed signal to which a CP is added to form an OFDM symbol which is converted into analog domain, mixed to desired frequency, power amplified (PA) and transmitted through an antenna.

This approach differs slightly from traditional OOK in that multiple carriers are used to generate the ON part. Therefore, the OOK scheme being standardized in 802.11ba is referred to as multicarrier OOK (MC-OOK). The duration of an ON/OFF part differs between the data rates, being 4 µs for the low data rate and 2 µs for the high data rate. The LDR ON/OFF duration of 4 µs is ideally suited for MC-OOK since the duration of an OFDM symbol in 802.11 a/g/n/ac is also 4 µs. On the other hand, the 2 µs duration used in HDR does require some minor modifications to the 802.11 transmitter.

The present disclosure aims for providing improvements on generation of the ON part, in particular in view of lean implementation. MC-OOK has been designed for ease of implementation in 802.11 access points (APs). However, the HDR employs 2 ON or OFF waveforms, which requires the transmitter to change the FFT size (e.g. 32 FFT), or to employ time masking of signals generated using a 64 point FFT. Even though the modifications needed in an 802.11 AP in order to support the 802.11ba HDR are slight, it may not be possible to implement it in legacy chipsets.

The above information disclosed in this Background section is only for enhancement of understanding of the background of the disclosure and therefore it may contain information that does not form the prior art that is already known to a person of ordinary skill in the art.

SUMMARY

The disclosure is based on the inventors' realization that applying certain symbols for the transformer makes it provide a desired OOK signal output.

According to a first aspect, there is provided a method of transmitting an On-Off Keying, OOK, signal which comprises an ON waveform and an OFF waveform forming a pattern representing transmitted information. The method comprises providing, for one binary value of information to be transmitted, a first set of complex-valued frequency domain symbols to an inverse fast Fourier transformer, or providing, for the other binary value of information to be transmitted, a second set of complex-valued frequency domain symbols to the inverse fast Fourier transformer. The method further comprises performing the inverse fast Fourier transform to form an orthogonal frequency division multiplex, OFDM representation, including a cyclic prefix, of the OOK signal of information to be transmitted, and transmitting the OFDM representation.

The first and second complex symbols may be determined by transforming a desired pattern representing binary information for the one binary value, selecting the first set of complex-valued frequency domain symbols as a set of complex-valued frequency domain symbols resembling the transformed desired pattern representing binary information for the one binary value, transforming a desired pattern representing binary information for the other binary value, and selecting the second set of complex-valued frequency domain symbols as a set of complex-valued frequency domain symbols resembling the transformed desired pattern representing binary information for the other binary value. The selecting of the first and second sets of complex-valued frequency domain symbols may comprise adapting the selection of the complex-valued frequency domain symbols such that a magnitude of a difference in signal energy of the OFDM representation below a centre frequency of the OFDM representation and a signal energy of the OFDM representation above the centre frequency of the OFDM representation is below a threshold to achieve power spectrum flattening by the respective sets. The selection of the complex-valued frequency domain symbols may comprise constraining selection such that symbols of each pair of frequency domain symbols with equal frequency offset to a centre frequency for the OFDM representation have equal magnitude.

The complex symbol may correspond to a quadrature amplitude modulated, QAM, symbol.

The pattern for respective transmitted binary information may be such that the transmitted power of the ON part exceeds the transmitted power of the OFF part.

A first subset of available subcarriers may be populated by the applied set of symbols and at least a second subset of available subcarriers may be usable for data transmission.

The Manchester coded OOK signal may comprise a repetition coding, and the method may comprise selecting a length of the cyclic prefix such that a duration of the generated OFDM representation and the cyclic prefix matches the duration of the Manchester and repetition coded OOK signal. The generated OFDM representation may be 12.8 µs and the cyclic prefix may be selected to be 3.2 µs. The set of complex-valued frequency domain symbols may populate 48 subcarriers of the OFDM representation, and may correspond to a 256 QAM symbol, wherein the first set of complex-valued frequency domain symbols provides the following complex values for the respective subcarrier: −5+1i, 7−5i, −5+5i, 5−7i, −5+9i, 3−9i, −3+13i, 3−9i, 3+15i, 1−9i, 7+15i, −1−9i, 11+11i, −1−9i, 15+7i, −1−9i, 15+3i, −3−11i, 15−3i, −3−11i, 11−7i, −5−11i, 5−9i, −7−11i, 1−9i, −9−11i, −5−7i, −13−9i, −7−3i, −13−7i, −9+3i, −15−3i, −7+7i, −15+1i, −3+11i, −13+3i, 1+13i, −11+7i, 5+11i, −7+9i, 9+9i, −3+9i, 9+5i, 1+9i, 9+1i, 3+7i, 7−3i, and 7+5i which provides an OFF-ON-OFF-ON pattern, and the second set of complex-valued frequency domain symbols provides the following complex values for the respective subcarrier: 1−5i, −9−1i, −3+7i, 7+5i, 7−7i, −5−9i, −11+5i, −1+9i, 15−1i, 5−9i, −15−5i, −9+3i, 11+11i, 9+3i, −7−15i, −7−7i, −1+15i, 1+11i, 5−13i, 7−9i, −9+9i, −11+5i, 9−5i, 13+3i, −9+3i, −9−11i, 7−1i, 3+15i, −7+1i, 5−15i, 9−1i, −11+11i, −9−1i, 15−3i, 11+5i, −13−3i, −9−9i, 11+7i, 5+11i, −5−11i, −1−11i, 1+11i, −3+11i, 1−9i, 5−7i, −3+7i, −5+3i, and 5−5i which provides an ON-OFF-ON-OFF pattern, where i indicates quadrature and the numbers represent a relative position in a signal constellation of the 256 QAM symbol.

The method may comprise that a subset of available subcarriers is populated by the applied set of symbols and other available subcarriers are nulled. The set of complex-valued frequency domain symbols may populate 12 subcarriers of the OFDM representation, a null, 0+i0, may be provided for populating at least one subcarrier, and may correspond to a 256 QAM symbol, wherein the first set of complex-valued frequency domain symbols may provide the following complex values for the respective subcarrier: −5−5i, −11+5i, −3+15i, 13+13i, 15−3i, 3−9i, 0, 9−3i, 3−15i, −13−13i, −15+3i, −5+11i, and 5+5i, and the second set of complex-valued frequency domain symbols may provide the following complex values for the respective subcarrier: 5−5i, −5+11i, −3−15i, 13+13i, −15−3i, 9−3i, 0, −3+9i, −3−15i, 13+13i, −15−3i, 11−5i, and −5+5i, where i indicates quadrature and the numbers represent a relative position in a signal constellation of the 256 QAM symbol.

According to a second aspect, there is provided a transmitter for transmitting an On-Off Keying, OOK, signal which comprises an ON waveform and an OFF waveform forming a pattern representing transmitted information. The transmitter comprises an inverse fast Fourier transformer, and a transmitter circuit. The transmitter is arranged to, for one binary value of information to be transmitted, provide a first set of complex-valued frequency domain symbols to the inverse fast Fourier transformer, or for the other binary value of information to be transmitted, provide a second set of complex-valued frequency domain symbols to the inverse fast Fourier transformer such that the inverse fast Fourier transform is enabled to be performed to form an orthogonal frequency division multiplex, OFDM representation, including a cyclic prefix, of the OOK signal of information to be transmitted. The transmitter circuit is arranged to transmit the OFDM representation.

The first and second sets of complex-valued frequency domain symbols may be such that the first set of complex-valued frequency domain symbols is a symbol set resembling a transform of a desired pattern representing binary information for the one binary value, and the second set of complex-valued frequency domain symbols is a symbol set resembling a transform of a desired pattern representing binary information for the other binary value. The complex symbol may correspond to a quadrature amplitude modulated, QAM, symbol.

The pattern for respective transmitted binary information may be such that the transmitted power of the ON part exceeds the transmitted power of the OFF part.

A first subset of available subcarriers may be populated by the applied set of symbols and at least a second subset of available subcarriers are usable for data transmission. The Manchester coded OOK signal may comprise a repetition coding, and a length of the cyclic prefix may be such that a duration of the generated OFDM representation and the cyclic prefix matches the duration of the Manchester and repetition coded OOK signal. The generated OFDM representation may be 12.8 µs and the cyclic prefix may be selected to be 3.2 µs. The set of complex-valued frequency domain symbols may populate 48 subcarriers of the OFDM representation, and may correspond to a 256 QAM symbol, wherein the first set of complex-valued frequency domain symbols may provide the following complex values for the respective subcarrier: −5+1i, 7−5i, −5+5i, 5−7i, −5+9i, 3−9i, −3+13i, 3−9i, 3+15i, 1−9i, 7+15i, −1−9i, 11+11i, −1−9i, 15+7i, −1−9i, 15+3i, −3−11i, 15−3i, −3−11i, 11−7i, −5−11i, 5−9i, −7−11i, 1−9i, −9−11i, −5−7i, −13−9i, −7−3i, −13−7i, −9+3i, −15−3i, −7+7i, −15+1i, −3+11i, −13+3i, 1+13i, −11+7i, 5+11i, −7+9i, 9+9i, −3+9i, 9+5i, 1+9i, 9+1i, 3+7i, 7−3i, and 7+5i which provides an OFF-ON-OFF-ON pattern, and the second set of complex-valued frequency domain symbols provides the following complex values for the respective subcarrier: 1−5i, −9−1i, −3+7i, 7+5i, 7−7i, −5−9i, −11+5i, −1+9i, 15−1i, 5−9i, −15−5i, −9+3i, 11+11i, 9+3i, −7−15i, −7−7i, −1+15i, 1+11i, 5−13i, 7−9i, −9+9i, −11+5i, 9−5i, 13+3i, −9+3i, −9−11i, 7−1i, 3+15i, −7+1i, 5−15i, 9−1i, −11+11i, −9−1i, 15−3i, 11+5i, −13−3i, −9−9i, 11+7i, 5+11i, −5−11i, −1−11i, 1+11i, −3+11i, 1−9i, 5−7i, −3+7i, −5+3i, and 5−5i which provides an ON-OFF-ON-OFF pattern, where i indicates quadrature and the numbers represents a relative position in a signal constellation of the 256 QAM symbol.

The first and second sets may be adapted such that a magnitude of a difference in signal energy of the OFDM representation below a centre frequency of the OFDM representation and a signal energy of the OFDM representation above the centre frequency of the OFDM representation is below a threshold to achieve power spectrum flattening. The complex-valued frequency domain symbols may be constrained such that symbols of each pair of frequency domain symbols with equal frequency offset to a centre frequency for the OFDM representation have equal magnitude.

A subset of available subcarriers may be populated by the applied set of symbols and other available subcarriers are nulled. The set of complex-valued frequency domain symbol may populate 12 subcarriers of the OFDM representation, a null, 0+i0, may be provided for populating at least one subcarrier, and may correspond to a 256 QAM symbol, wherein the first set of complex-valued frequency domain symbols may provide the following values for the respective subcarrier: −5−5i, −11+5i, −3+15i, 13+13i, 15−3i, 3−9i, 0, 9−3i, 3−15i, −13−13i, −15+3i, −5+11i, and 5+5i, and the second set of complex-valued frequency domain symbols may provide the following complex values for the respective subcarrier: 5−5i, −5+11i, −3−15i, 13+13i, −15−3i, 9−3i, 0, −3+9i, −3−15i, 13+13i, −15−3i, 11−5i, and −5+5i, where i indicates quadrature and the numbers represent a relative position in a signal constellation of the 256 QAM symbol.

According to a third aspect, there is provided a computer program comprising instructions which, when executed on a processor of a communication apparatus, causes the communication apparatus to perform the method according to the first aspect.

An advantage of some embodiments is the possibility for low implementation complexity.

BRIEF DESCRIPTION OF THE DRAWINGS

The above, as well as additional objects, features and advantages of the present disclosure, will be better understood through the following illustrative and non-limiting detailed description of preferred embodiments of the present disclosure, with reference to the appended drawings.

DETAILED DESCRIPTION

Figure 1:
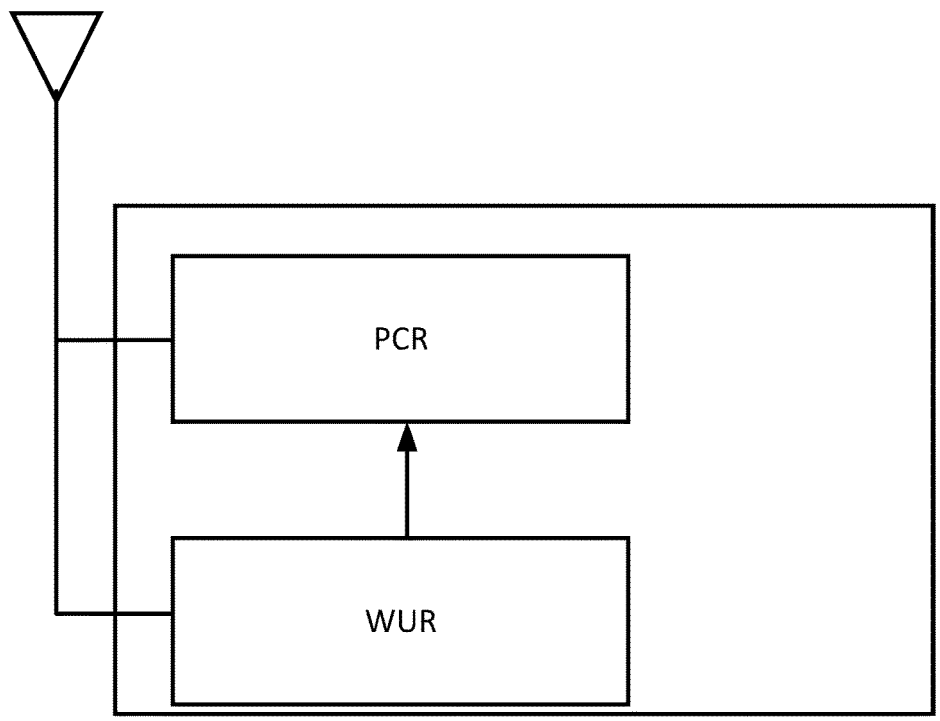
FIG. 1 schematically illustrates a receiver having a traditional WUR and PCR structure.
Figure 2:
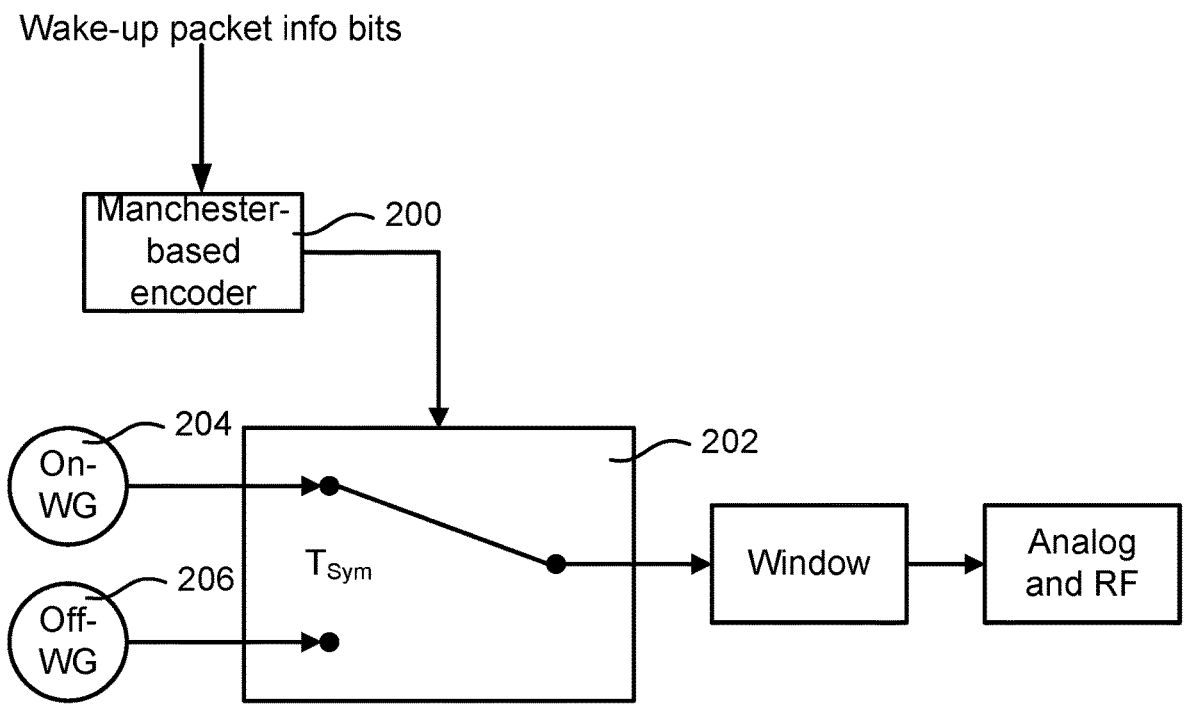
FIG. 2 schematically illustrates a traditional OOK structure.
Figure 3:
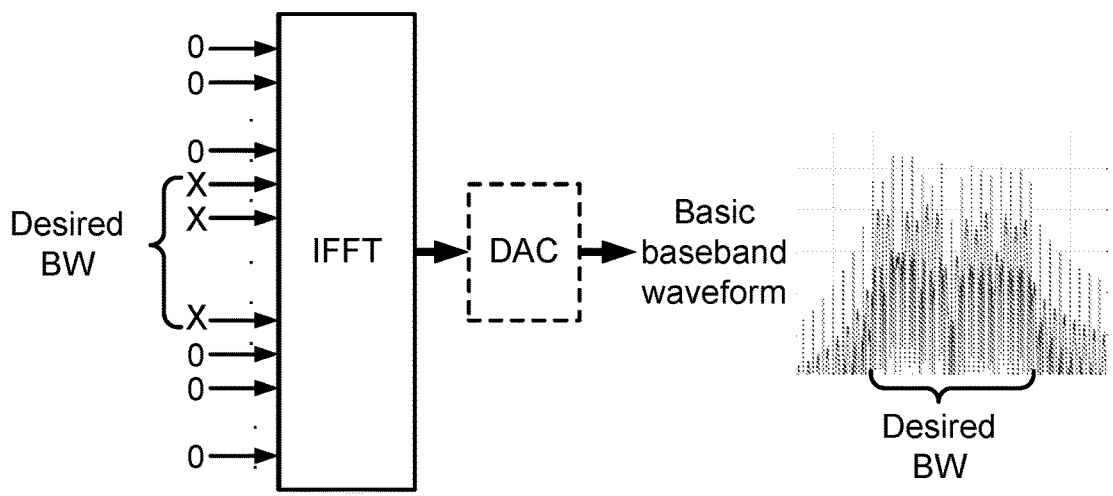
FIG. 3 schematically illustrates a structure for generating a basic baseband waveform using IFFT.
Figure 4:
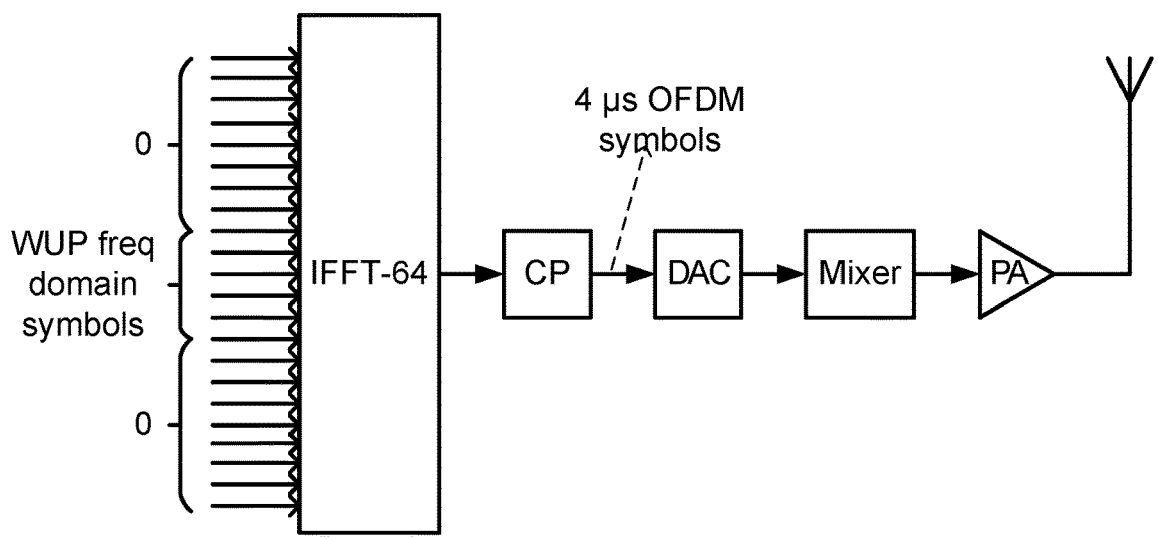
FIG. 4 is a block diagram schematically illustrating a transmitter.
Figure 5:
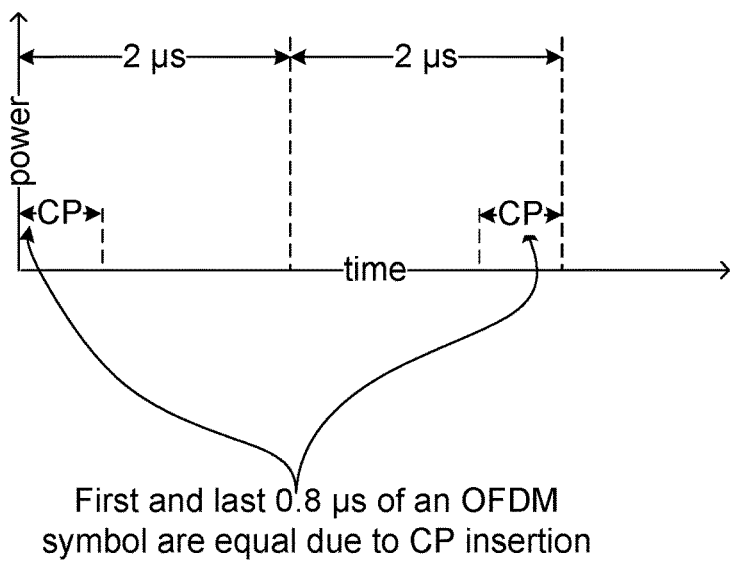
FIG. 5 is a power to time diagram illustrating issues related to CP insertion.

A solution to the problem would be found if it were possible to find frequency domain symbols such that after transformation to the time domain via an IFFT and CP insertion, an ON-OFF or OFF-ON waveform could be obtained. Unfortunately, this is not possible to achieve. The reason is that the CP insertion implies that the first part and the end part of the OFDM symbol are equal. FIG. 5 is a power to time diagram illustrating issues related to the CP insertion.

Figure 6:
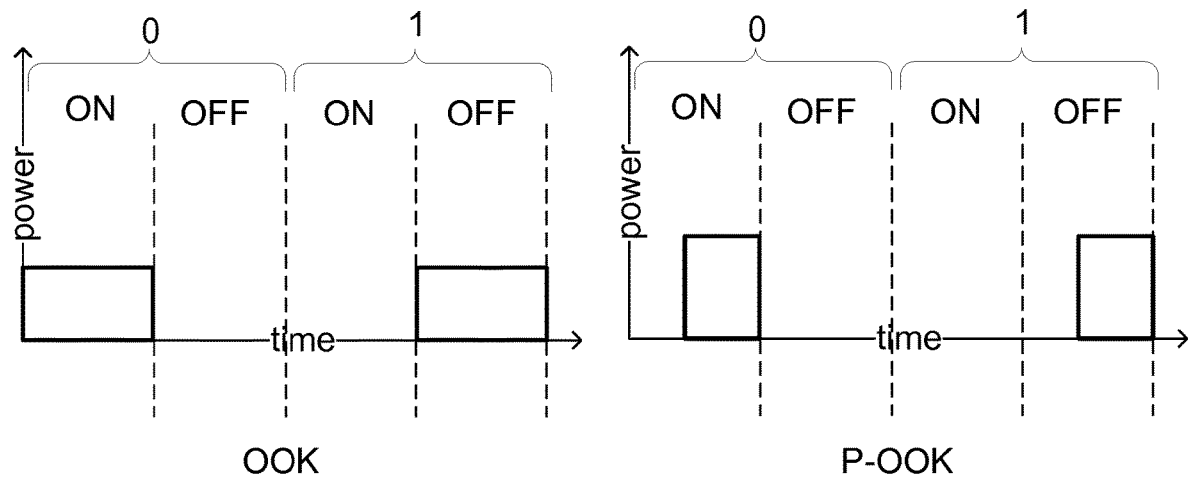
FIG. 6 illustrates the difference between OOK and P-OOK.

In order to solve the problem created by the CP insertion, it is suggested to apply some principles referred to as Partial OOK (P-OOK) in IEEE 802.11-17/1673r1, with title "Partial OOK—Generalizing the Blank GI Idea". FIG. 6 illustrates the difference between OOK and P-OOK.

P-OOK introduces shortening and power boosting of ON waveforms. In addition, it was shown in IEEE 802.11-17/1673r1 that P-OOK can yield non-negligible performance gains when compared to OOK. It was also shown that P-OOK yields good performance even if the receiver is designed to receive OOK and is not aware that the actual received signal has been generated by means of P-OOK. In fact, the crude receiver only needs to compare energies between the first part of the OOK signal and the second part to determine the transmitted bit.

The disclosed approach replaces the OFF waveform by a low power waveform, relative to the power of the ON signal. In addition, the disclosed approach replaces OOK with P-OOK. P-OOK is a useful idea because even though it is not possible to use an IFFT to generate a Manchester coded ON/OFF or OFF/ON symbol, where both the ON and OFF have a duration of 2 us, it is possible to find frequency domain symbols that generate P-OOK as illustrated in FIG. 7, despite the above discussed issues related to the CP insertion.

It is therefore proposed to design two sets of frequency domain symbols, say $\{X_k\}$ and $\{Y_k\}$ such that the OFF power is lower than the ON power, and that generate P-OOK. Each OFDM symbol generated from either set of frequency domain symbols would result in a Manchester coded MC-OOK symbol.

Figure 7:
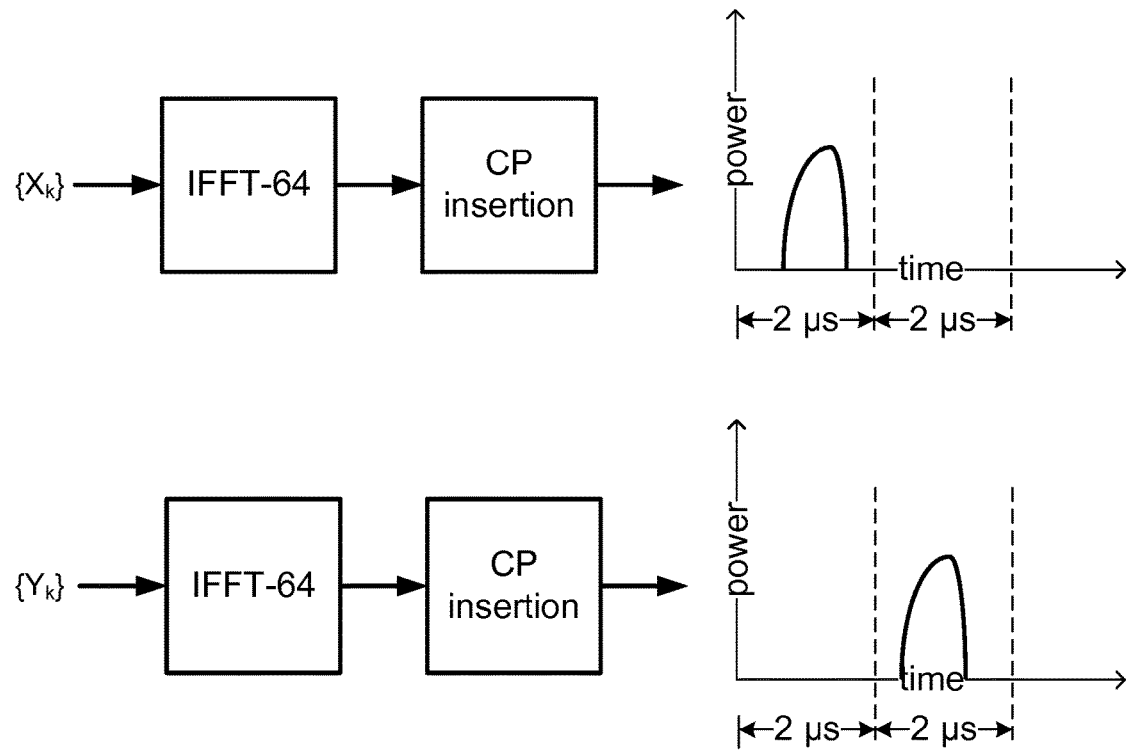
FIG. 7 illustrates examples of generated signal patterns.

To determine a suitable symbol to feed the IFFT to achieve a usable partial MC-OOK as discussed above, one way is to assign a desired pattern, e.g. as of FIG. 7, where the parts used by the CP, as illustrated in FIG. 5, are designed to have low power. The desired pattern for the respective bit value can then be transformed using a transformer corresponding to the IFFT to be used. The respective transformed patterns can then be used to feed the IFFT for the respective bit values. The transformed patterns then form a first and a second special symbol to be applied. Alternatively, a standard symbol resembling the respective transformed patterns may be selected, e.g. from a 256 QAM signal constellation, and be used to feed the IFFT. For the latter solution, it can be noted that the larger signal room, i.e., the larger modulation alphabet that is used, the more likely there is a fairly resembling symbol to the desired pattern. However, due to the inherent robustness of the OOK approach, the resemblance may be quite liberal, which however is depending on the application of the OOK signal and performance requirements such as range, limitations on signal strength, etc. For example, for some implementations a selected 64 QAM symbol may be sufficient while for others it may be required to use selected 256, 512 or 1024 QAM symbols, or using the special symbols taken directly from the transformation of the desired pattern.

Figure 8:
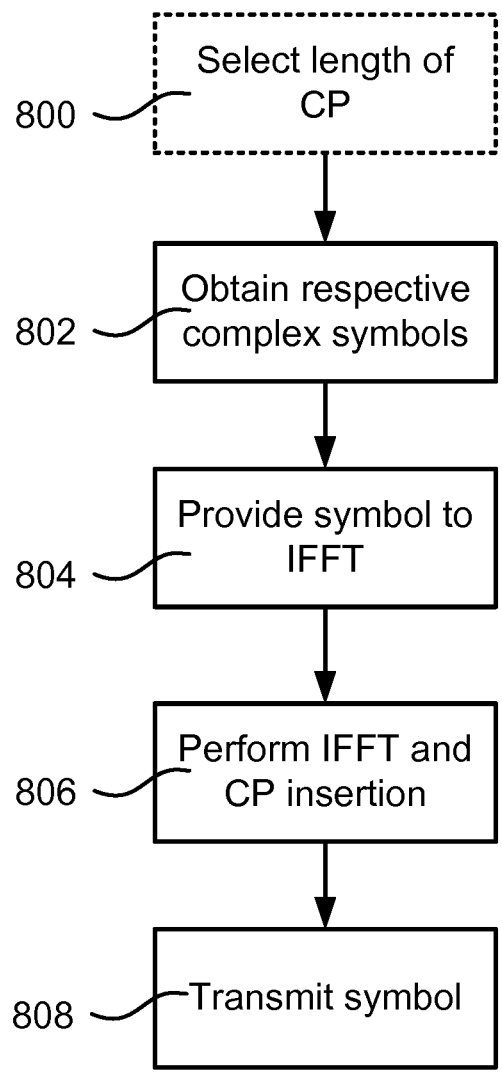
FIG. 8 is a flow chart illustrating a method according to an embodiment.

FIG. 8 is a flow chart schematically illustrating a method according to embodiments. The method relates to transmitting an On-Off Keying, OOK, signal which comprises an ON waveform and an OFF waveform forming a pattern representing transmitted binary information as a Manchester code. For some applications, i.e. where a length of CP is configurable, a suitable length of CP is selected 800. The method comprises providing 804 a first set of complex-valued frequency domain symbols for one binary value of information to be transmitted or a second set of complex-valued frequency domain symbols for the other binary value of information to be transmitted to an inverse fast Fourier transformer. The respective sets of complex-valued frequency domain symbols may be obtained 802 through different ways, e.g. a look-up table, pre-configured design of the P-OOK modulator, etc. and the determination of the symbol sets may be done in different ways. One way is elucidated below with reference to FIG. 9. The sets of complex-valued frequency domain symbols may correspond to a quadrature amplitude modulated, QAM, symbol, e.g. as demonstrated above.

The inverse fast Fourier transform is performed 806, including insertion of a cyclic prefix, CP, to form an orthogonal frequency division multiplex, OFDM representation of the OOK signal of information to be transmitted. The OFDM representation is then transmitted 808.

The pattern for respective transmitted binary information is preferably such that the transmitted power of the ON part exceeds the transmitted power of the OFF part such that the receiver complexity may be kept low, i.e. only needing to compare energy levels between first part and second part of the received symbol representing a binary value.

The bandwidth of the WUP transmission is preferably narrower than the bandwidth of the data sent to the PCR, wherein a subset of available subcarriers, corresponding to the bandwidth of the WUP transmission, is populated by the applied set of symbols and other available subcarriers are nulled. Alternatively, as will be discussed below, some subcarriers are nulled to provide a guard band for the WUP transmission and then other communication is multiplexed within the available subcarriers.

Figure 9:
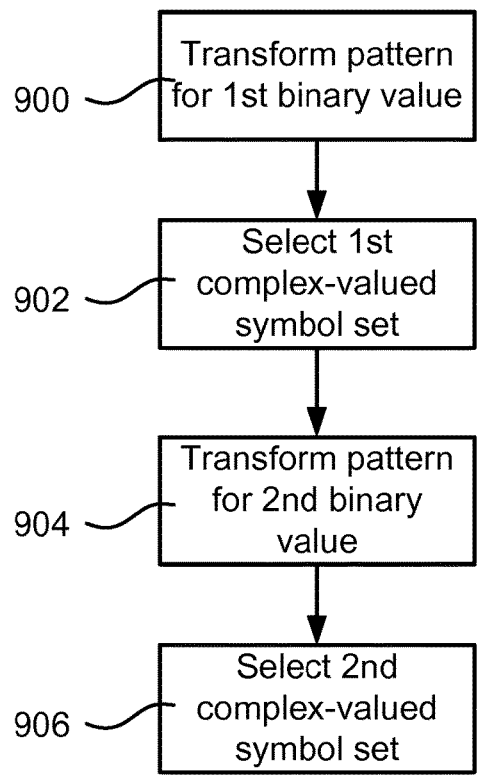
FIG. 9 is a flow chart illustrating a method according to an embodiment.

FIG. 9 is a flow chart illustrating an approach for determining the first and second sets of symbols. As discussed above, the sets of symbols should produce an output which resembles the desired P-OOK signals. The determination of the sets of symbols may be performed in advance, in view of the transmission occurrence and even in view of the taking of the transmitter into operation such as installation or initial setup of devices, and be stored to then be used upon transmission of a WUP. As also discussed above, the set of symbols may be a special set determined directly from a transform of a desired signal pattern for the respective P-OOK symbol, or be a selected symbol according to a signal constellation, e.g. 64, 128, 256, 512 or 1024 QAM, used by the transmitter. Here, the storing may thus be more or less complex. For the case of special symbol sets, the parameters for the symbols may be stored, e.g. with a desired precision, while for a selected symbol set only a symbol set value may be stored. The approach for determining the sets of symbols may be according to the approach illustrated in FIG. 9, which employs selecting resembling symbol sets according to a signal constellation used by the transmitter, comprises transforming 900 a signal pattern corresponding to a signal desired to be transmitted for one binary value. A first complex-valued symbol set matching, to a desired degree, the transformed signal pattern is then selected 902. For the other binary value, the similar actions are taken, i.e. transforming 904 a signal pattern corresponding to a signal desired to be transmitted for the other binary value and a first complex-valued symbol set matching, to a desired degree, the transformed signal pattern is then selected 906.

The selecting of the first and second sets of complex-valued frequency domain symbols may not only be based on resemblance with the transformed signal patterns but may also comprise adapting the selection of the complex-valued frequency domain symbols for example such that power spectrum flattening is achieved by the respective sets. An exemplary approach for achieving power spectrum flattening is to adapt the selection of the complex-valued frequency domain symbols by constraining selection such that symbols of each pair of frequency domain symbols with equal frequency offset to a centre frequency for the OFDM representation has equal magnitude. That is, the absolute value of the complex-valued frequency domain symbols of each such pair are about equal, as far as resolution of symbol selection allows. As will be discussed below, the selection may also include to select symbol sets which preserve orthogonality to other symbol sets used for multiplexing e.g. payload into subcarriers which are not used by the WUP. Thus, selection may include trading flattening and preservation of orthogonality such that desired properties in sense of flat spectrum and sufficient orthogonality are achieved.

There are suggested developments for IEEE 802.11 comprising further flavours to the IEEE 802.11 family. One of them introduces, among other things, orthogonal frequency division multiple access (OFDMA). One suggestion is that OFDMA may be used to transmit to several users concurrently in the downlink (DL) and to receive from several users concurrently in the uplink (UL). For this, it is also introduced a new numerology, based on 256 point FFT, with an OFDM symbol duration of 12.8 µs. The duration of the cyclic prefix is configurable: 0.8 µs, 1.6 µs or 3.2 µs.

Figure 10:
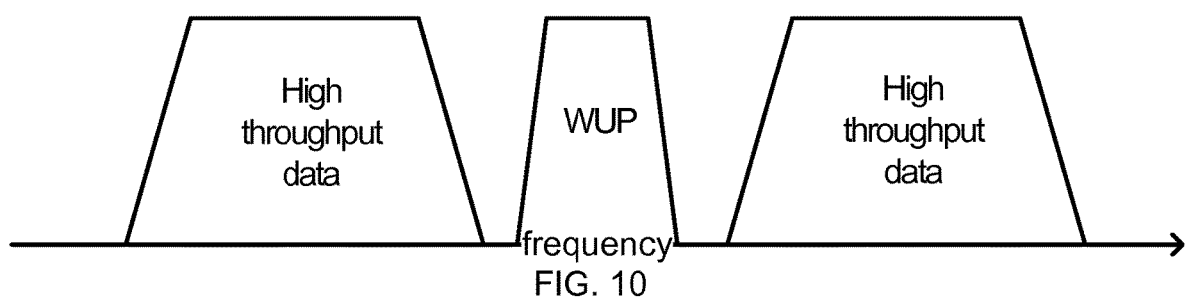
FIG. 10 illustrates multiplexing of high throughput data and WUP.

The spectrum efficiency of the WUP is quite low. Indeed, a WUP may for example reserve a 20 MHz channel to transmit a 4 MHz signal with a data rate of 62.5 kbps. The introduction of OFDMA in some IEEE 802.11 flavours with resource units (RUs) as narrow as 2 MHz, enables frequency domain multiplexing of high throughput data and WUPs, for example as schematically illustrated in FIG. 10. This would significantly increase the spectrum efficiency related to only transmitting the WUP. A problem arises because the OFDMA based on the 256 point FFT and the OFDM symbol duration before CP insertion of 12.8 µs. Hence, even though the WUP can be generated by means of an OFDM transmitter, but when for example it is specified in terms of a 64 point IFFT and OFDM symbols with a 4 µs duration, the WUP may not be orthogonal to any user data allocated to an RU. In other words, any multiplexed RUs allocated to user data may be interfered by leakage from the WUP. To multiplex the WUP and the user data by means of OFDMA may be accomplished by generating the WUP via a 256 point IFFT, followed by CP insertion. Here, in MC-OOK, after Manchester coding and repetition coding, a logical 1 is represented by an OFF ON OFF ON waveform with a total duration of 16 µs. Similarly, a logical 0 is represented by an ON OFF ON OFF waveform with a total duration of 16 µs. Moreover, each ON or OFF portion has a duration of 4 µs. On the other hand, employing the newly proposed numerology with 3.2 µs cyclic prefix, the duration of one OFDM symbol is also 16 µs. The current disclosure discloses methods to generate one OFDM symbol, employing the newly proposed numerology, such that the resulting 16 µs waveform has 4 MHz bandwidth and exhibits a power distribution similar to a 16 µs Manchester coded, repetition coded MC-OOK symbol.

An approach for producing an OFDM signal resembling a desired P-OOK and being particularly suitable for frequency domain multiplexing with other user signals within a channel will be given below as a tangible example.

Figure 11:
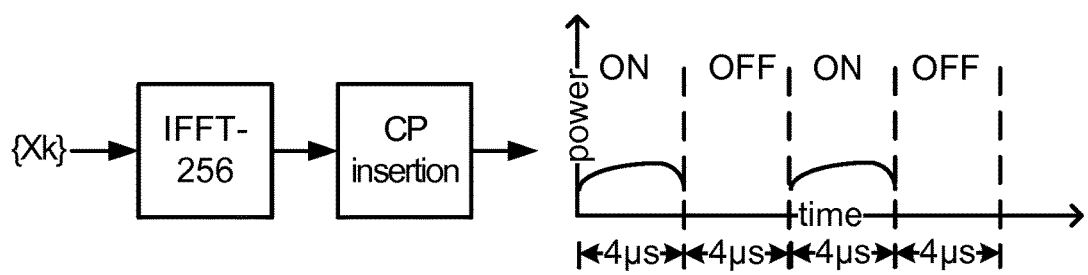
FIG. 11 illustrates an example of pattern generation according to an embodiment.
Figure 12:
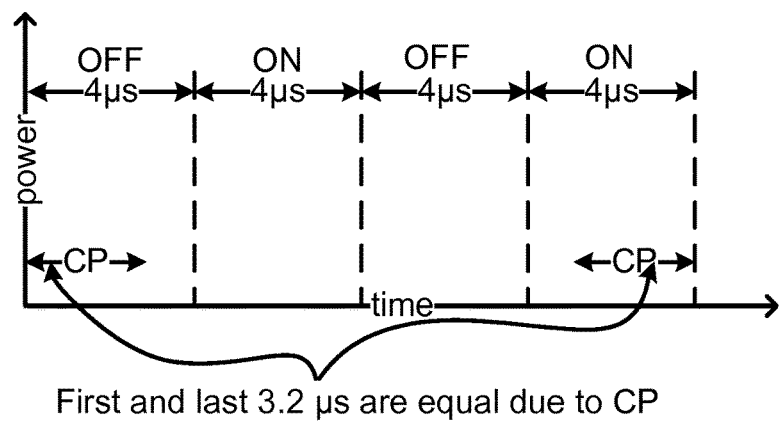
FIG. 12 illustrates the CP issue for an example.
Figure 13:
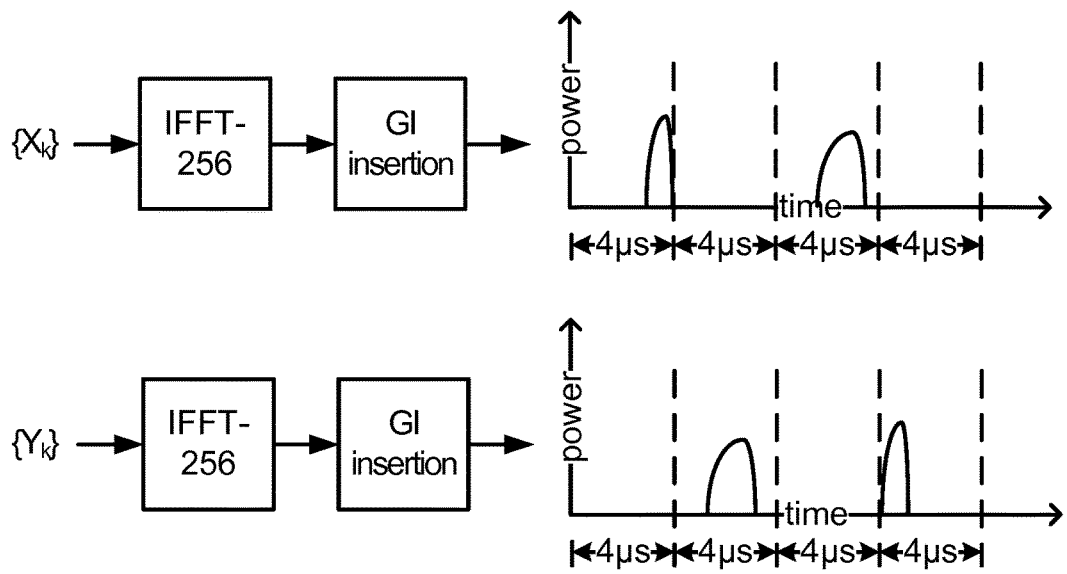
FIG. 13 illustrates an example of pattern generation according to an embodiment.

A first step is to configure the CP to be 3.2 µs. In this way the duration of an OFDM symbol (including CP) would be 16 µs, thus being equal to the duration of one Manchester and repetition coded MC-OOK symbol. A task is now to find sets of frequency domain symbols such that after transformation to the time domain via an IFFT and CP insertion, an ON-OFF-ON-OFF or OFF-ON-OFF-ON waveform could be obtained. This is schematically illustrated in FIG. 11. The CP issue needs to be addressed, and for this particular case, the CP issue is illustrated through FIG. 12. The desired P-OOK signal pattern is adapted to address the CP issue, which is illustrated in FIG. 13.

Figure 14:
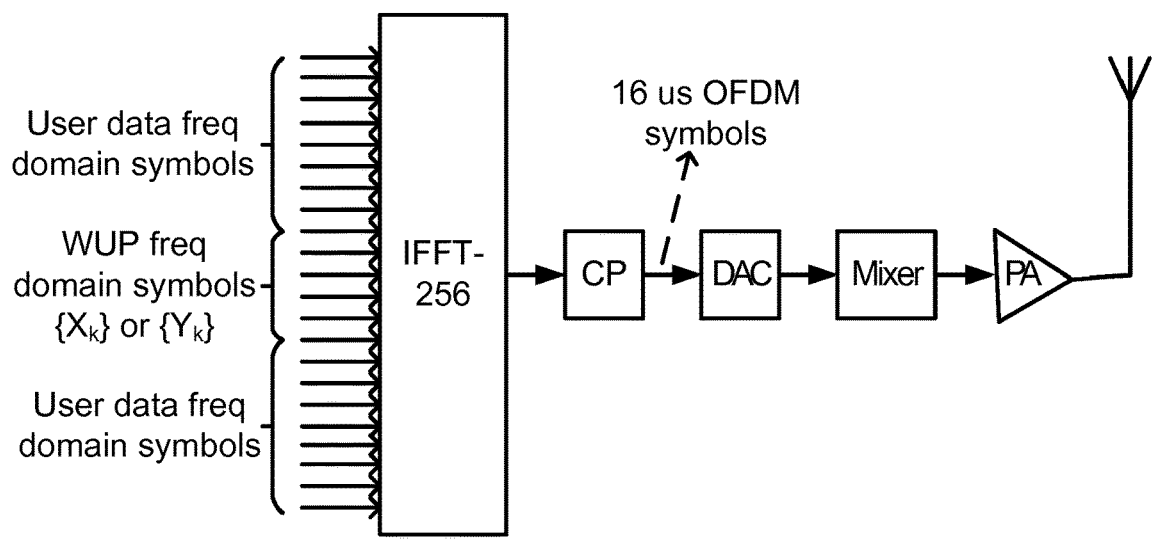
FIG. 14 illustrates an example of signal generation according to an embodiment.

Thus, two sets of frequency domain symbols, say $\{X_k\}$ and $\{Y_k\}$, are designed such that the OFF power is lower to the ON power, and that generate a P-OOK signal pattern. The number of frequency domain symbols depends on the bandwidth allocated to the WUP. Each OFDM symbol generated from either set of frequency domain symbols would result in a Manchester coded MC-OOK symbol. In this way, user data and WUP can be multiplexed, via OFDMA as illustrated in FIG. 14.

Figure 15:
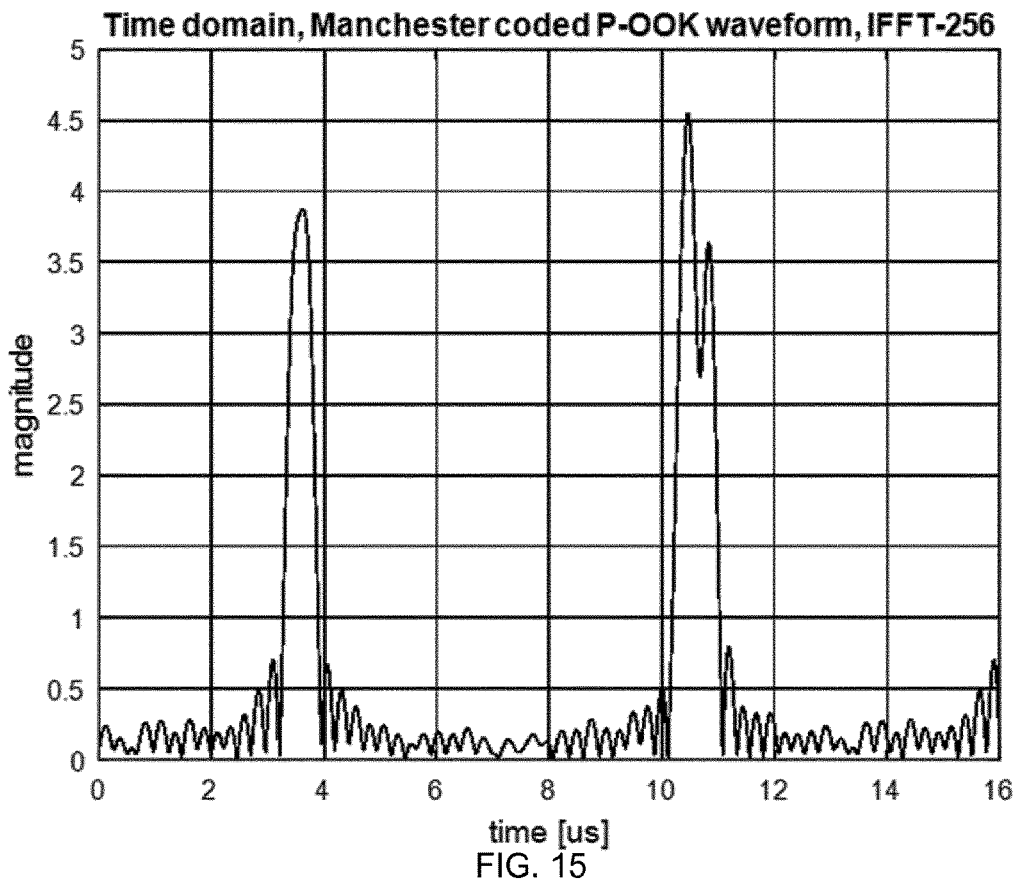
FIGS. 15 and 16 show the resulting time diagrams for symbol sets according to an example.
Figure 16:
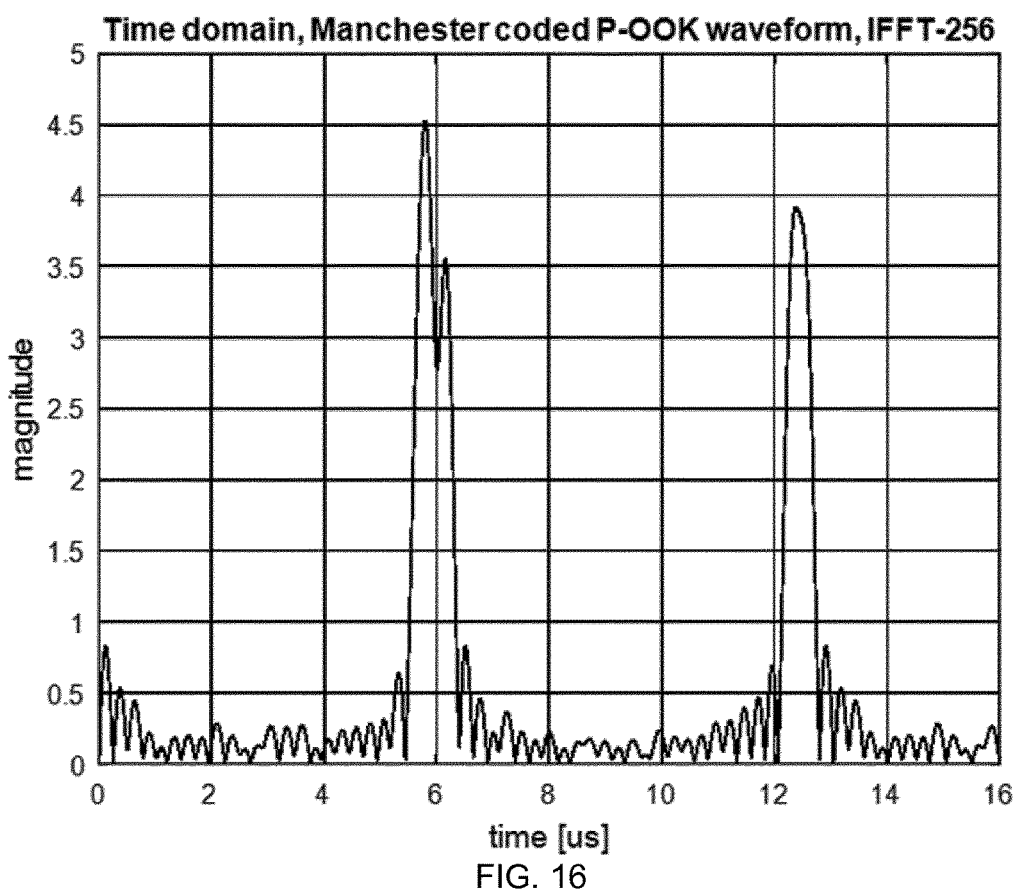
Figure 17:
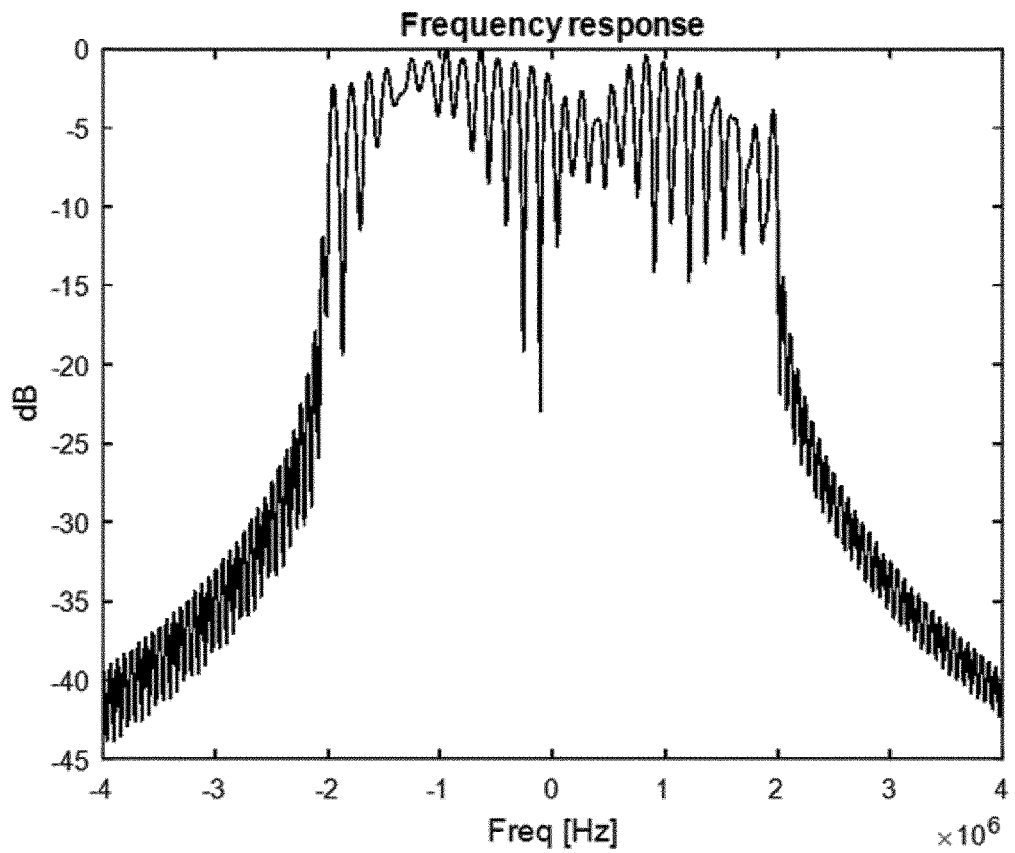
FIGS. 17 and 18 show frequency diagrams, respectively, for the signals illustrated in FIGS. 15 and 16.
Figure 18:
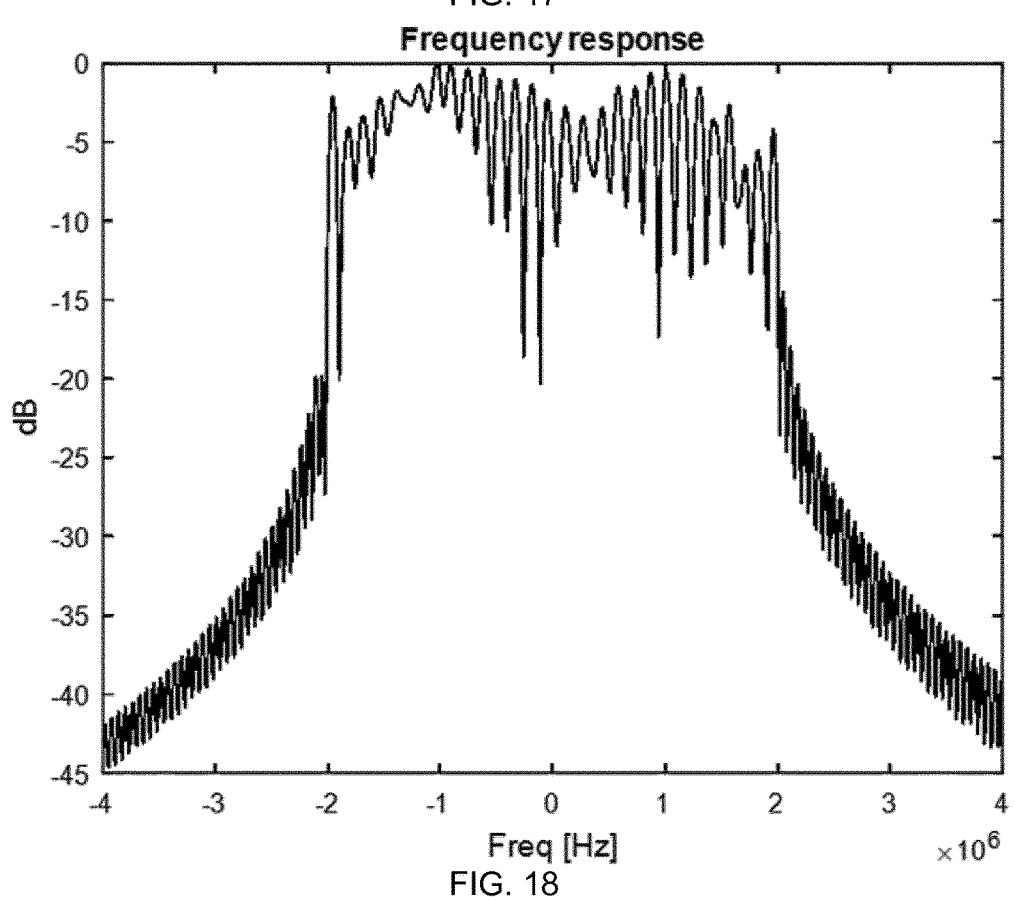

Table 1 shows an example of two sets of symbols suitable for generation of low-data rate WUPs. The values are between −15 and 15 in odd numbers, to simply represent signal points of the signal constellation for easier understanding, and the quadrature indicated by "i", resulting in a representation of the symbols among the 256 signal points. The bandwidth of the signals is approximately 4 MHz. The power ratio of ON part to OFF part is larger than 16 dB. FIGS. 15 and 16 show the resulting time diagrams for the symbol sets of Table 1 and FIGS. 17 and 18 show the resulting frequency diagrams, respectively.

TABLE 1

| {$X_k$} OFF-ON-OFF-ON | | {$Y_k$} ON-OFF-ON-OFF | |
|---|---|---|---|
| subcarrier | 256-QAM | subcarrier | 256-QAM |
| −24 | −5 + 1i | −24 | 1 − 5i |
| −23 | 7 − 5i | −23 | −9 − 1i |
| −22 | −5 + 5i | −22 | −3 + 7i |
| −21 | 5 − 7i | −21 | 7 + 5i |
| −20 | −5 + 9i | −20 | 7 − 7i |
| −19 | 3 − 9i | −19 | −5 − 9i |
| −18 | −3 + 13i | −18 | −11 + 5i |
| −17 | 3 − 9i | −17 | −1 + 9i |
| −16 | 3 + 15i | −16 | 15 − 1i |
| −15 | 1 − 9i | −15 | 5 − 9i |
| −14 | 7 + 15i | −14 | −15 − 5i |
| −13 | −1 − 9i | −13 | −9 + 3i |
| −12 | 11 + 11i | −12 | 11 + 11i |
| −11 | −1 − 9i | −11 | 9 + 3i |
| −10 | 15 + 7i | −10 | −7 − 15i |
| −9 | −1 − 9i | −9 | −7 − 7i |
| −8 | 15 + 3i | −8 | −1 + 15i |
| −7 | −3 − 11i | −7 | 1 + 11i |
| −6 | 15 − 3i | −6 | 5 − 13i |
| −5 | −3 − 11i | −5 | 7 − 9i |
| −4 | 11 − 7i | −4 | −9 + 9i |
| −3 | −5 − 11i | −3 | −11 + 5i |
| −2 | 5 − 9i | −2 | 9 − 5i |
| −1 | −7 − 11i | −1 | 13 + 3i |
| 0 | 1 − 9i | 0 | −9 + 3i |
| 1 | −9 − 11i | 1 | −9 − 11i |
| 2 | −5 − 7i | 2 | 7 − 1i |
| 3 | −13 − 9i | 3 | 3 + 15i |
| 4 | −7 − 3i | 4 | −7 + 1i |
| 5 | −13 − 7i | 5 | 5 − 15i |
| 6 | −9 + 3i | 6 | 9 − 1i |
| 7 | −15 − 3i | 7 | −11 + 11i |

TABLE 1-continued

| {X_k} OFF-ON-OFF-ON | | {Y_k} ON-OFF-ON-OFF | |
|---|---|---|---|
| subcarrier | 256-QAM | subcarrier | 256-QAM |
| 8 | −7 + 7i | 8 | −9 − 1i |
| 9 | −15 + 1i | 9 | 15 − 3i |
| 10 | −3 + 11i | 10 | 11 + 5i |
| 11 | −13 + 3i | 11 | −13 − 3i |
| 12 | 1 + 13i | 12 | −9 − 9i |
| 13 | −11 + 7i | 13 | 11 + 7i |
| 14 | 5 + 11i | 14 | 5 + 11i |
| 15 | −7 + 9i | 15 | −5 − 11i |
| 16 | 9 + 9i | 16 | −1 − 11i |
| 17 | −3 + 9i | 17 | 1 + 11i |
| 18 | 9 + 5i | 18 | −3 + 11i |
| 19 | 1 + 9i | 19 | 1 − 9i |
| 20 | 9 + 1i | 20 | 5 − 7i |
| 21 | 3 + 7i | 21 | −3 + 7i |
| 22 | 7 − 3i | 22 | −5 + 3i |
| 23 | 7 + 5i | 23 | 5 − 5i |

The Manchester coded OOK signal may as give in the example above comprise a repetition coding, and the method may comprise selecting a length of the cyclic prefix such that a duration of the generated OFDM representation and the cyclic prefix matches the duration of the Manchester and repetition coded OOK signal. In the example given above the generated OFDM representation is 12.8 μs and the cyclic prefix is selected to be 3.2 μs.

While the embodiments demonstrated above with reference to FIGS. 7 to 14 suggests an approach for an OFDM signal resembling a desired P-OOK and being particularly suitable for frequency domain multiplexing with other user signals within a channel, a general approach for producing an OFDM signal resembling a desired P-OOK will be given below as another tangible example.

Table 2 illustrates values for a 256 QAM symbol for a 12 subcarrier solution (plus nulled DC subcarrier) which provide feasible respective patterns. The values are between −15 and 15 in odd numbers, to simply represent signal points of the signal constellation for easier understanding, and the quadrature indicated by "i", resulting in a representation of the symbols among the 256 signal points.

TABLE 2

| {Xk} ON-OFF | | {Yk} OFF-ON | |
|---|---|---|---|
| subcarrier | 256-QAM | subcarrier | 256-QAM |
| −6 | −5 − 5i | −6 | 5 − 5i |
| −5 | −11 + 5i | −5 | −5 + 11i |
| −4 | −3 + 15i | −4 | −3 − 15i |
| −3 | 13 + 13i | −3 | 13 + 13i |
| −2 | 15 − 3i | −2 | −15 − 3i |
| −1 | 3 − 9i | −1 | 9 − 3i |
| 0 | 0 | 0 | 0 |
| 1 | 9 − 3i | 1 | −3 + 9i |
| 2 | 3 − 15i | 2 | −3 − 15i |
| 3 | −13 − 13i | 3 | 13 + 13i |
| 4 | −15 + 3i | 4 | −15 − 3i |
| 5 | −5 + 11i | 5 | 11 − 5i |
| 6 | 5 + 5i | 6 | −5 + 5i |

In the example of Table 2, the power ratio of ON part to OFF part is larger than 19 dB, which is far more than needed for many applications, where about 10 dB may be sufficient.

Figure 23:
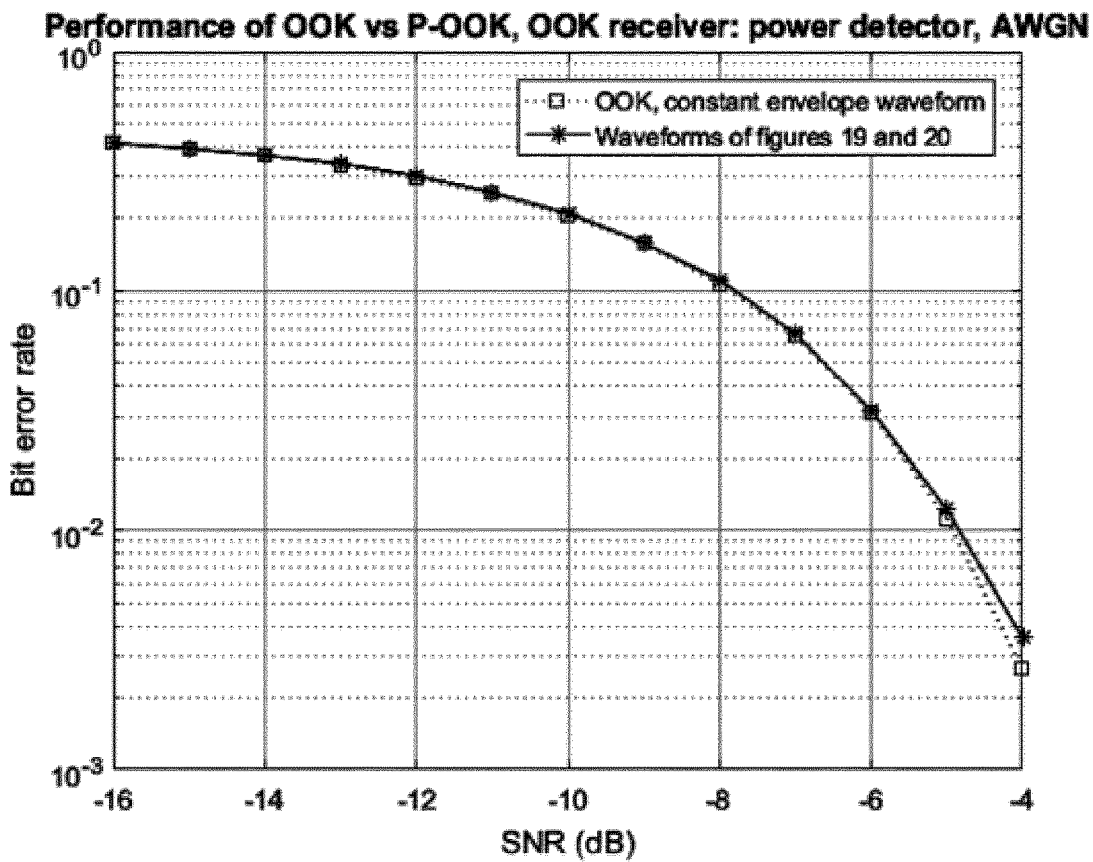
FIG. 23 is a diagram comparing performance between an ideal OOK signal and suggested signals according to an example.

As discussed above, for the OOK receiver it does not normally matter whether an OOK signal or a P-OOK signal is transmitted as long as the signal energy between ON and OFF parts are distinguishable. FIG. 23 is a diagram comparing performance between an ideal OOK signal and the suggested signals as of FIGS. 19 and 20. Here it can be seen that the performance loss is moderate to negligible.

Figure 19:
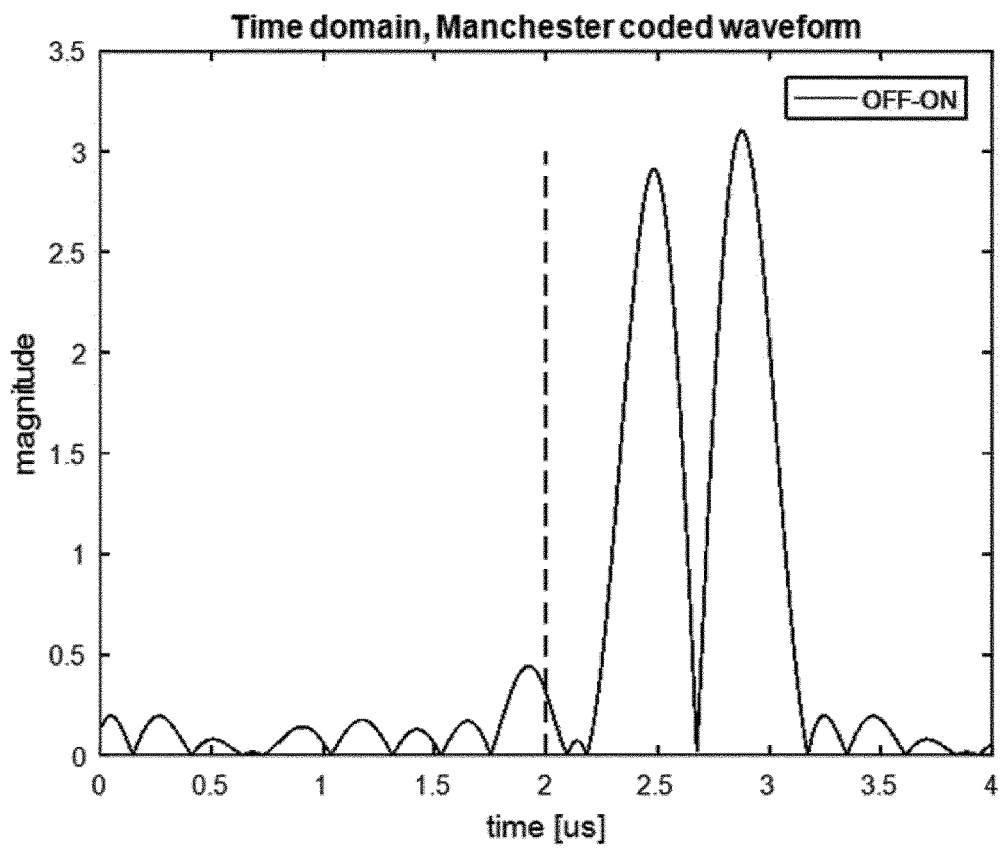
FIGS. 19 and 20 show the resulting time diagrams for symbol sets according to an example.
Figure 20:
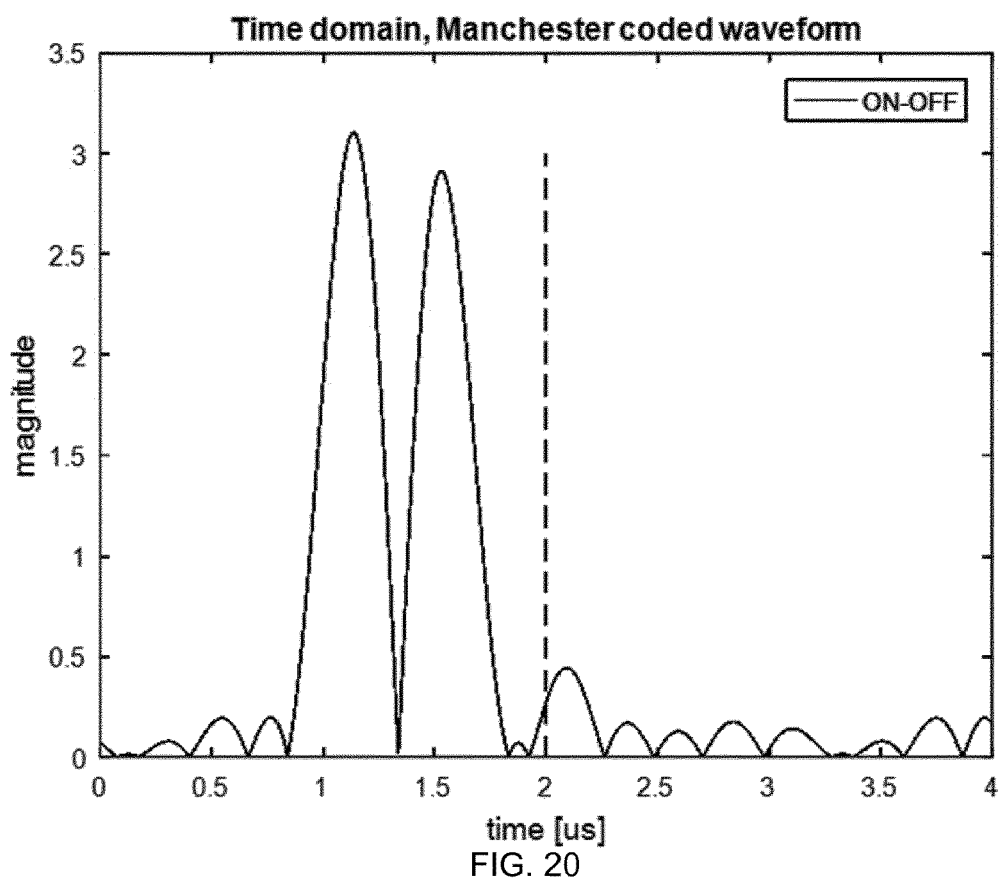
Figure 21:
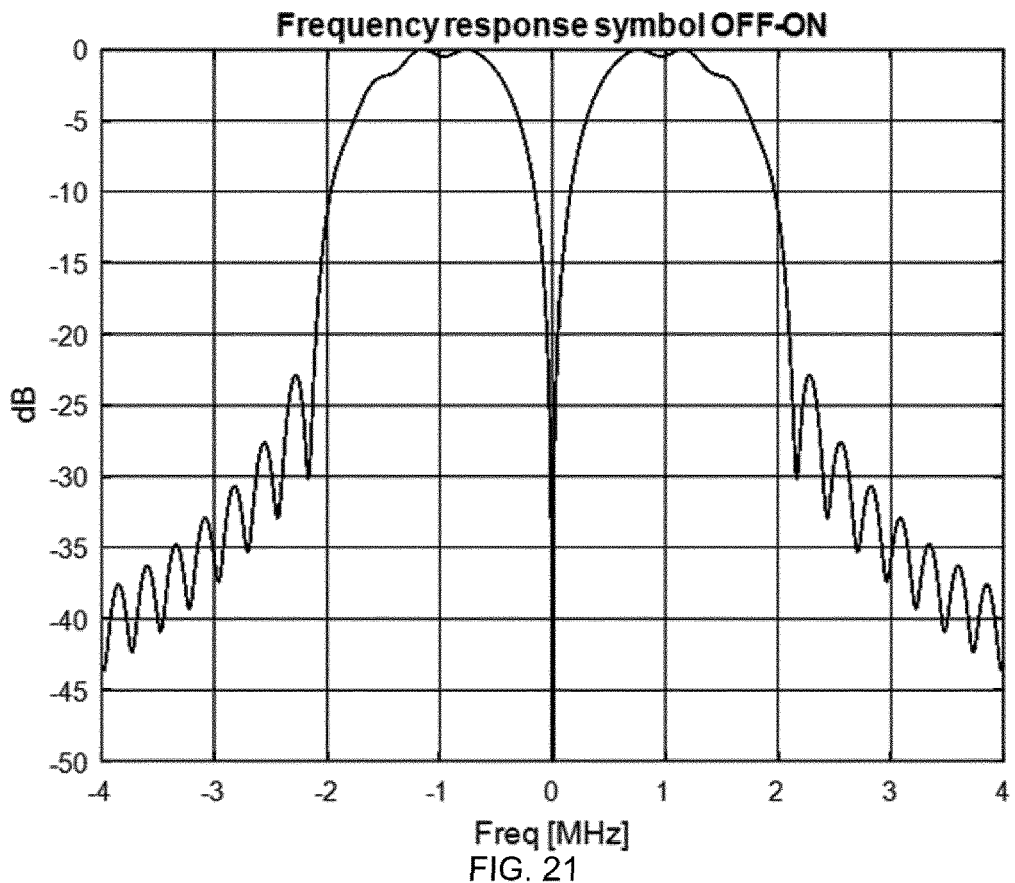
FIGS. 21 and 22 illustrate frequency responses for the respective patterns as illustrated in FIGS. 19 and 20, respectively.
Figure 22:
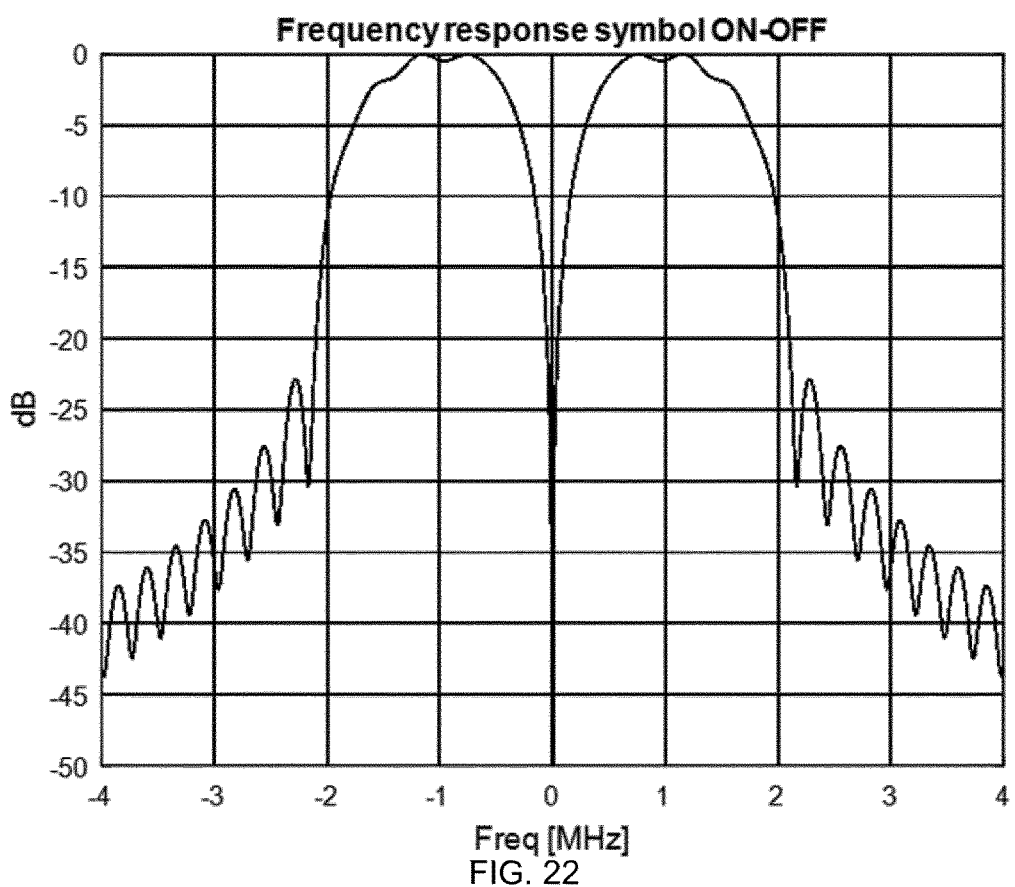

FIGS. 19 and 20 are signal diagrams illustrating a resulting output pattern for the example given with reference to Table 2. FIGS. 21 and 22 illustrate frequency responses for the respective patterns as illustrated in FIGS. 19 and 20, respectively.

The selecting of the first and second sets of complex-valued frequency domain symbols may, as demonstrated above with reference to some examples, comprise adapting the selection of the complex-valued frequency domain symbols to achieve certain properties. One example of such properties is a reasonably flat frequency response, in order to harvest frequency diversity gains in frequency selective propagation channels. For example, the symbol set may be selected taking the flat frequency response into account such that a magnitude of a difference in signal energy of the OFDM representation below a centre frequency of the OFDM representation and a signal energy of the OFDM representation above the centre frequency of the OFDM representation is below a threshold to achieve power spectrum flattening by the respective sets. For example, the threshold may be set to 3 dB for some embodiments, but may be more rigid, e.g. 1 dB, for some embodiments. Here, the signal energy of the two compared parts of the OFDM representation may be determined by testing or simulating candidate symbol sets, and observing the aggregated signal energy within the frequency band of the MC-OOK signal for the respective parts and comparing them, and determining whether the threshold is met. The testing or simulating may be performed in advance and the result may be stored in a look-up table which is accessed during operation. This testing and simulating approach is also applicable for other properties of the generated MC-OOK signal.

Figure 24:
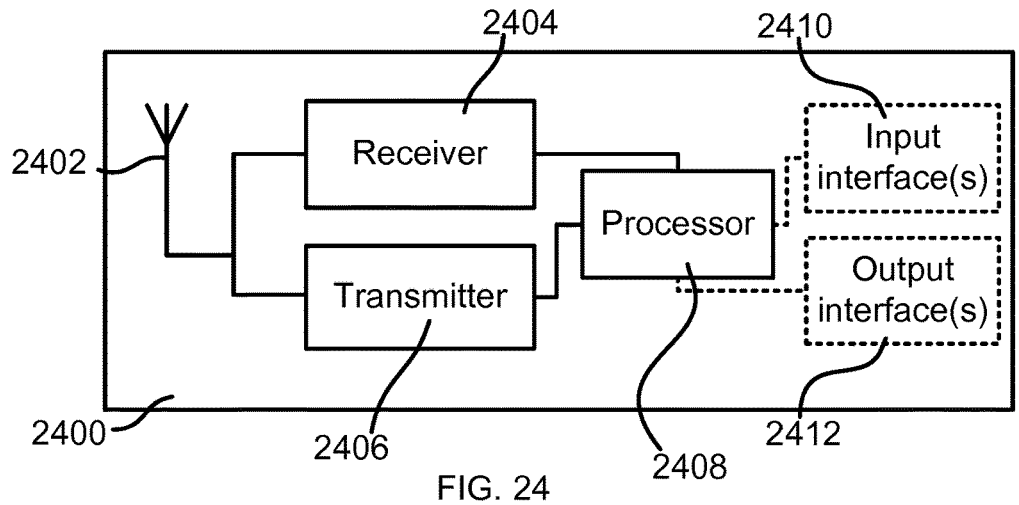
FIG. 24 is a block diagram schematically illustrating a network node according to an embodiment.

FIG. 24 is a block diagram schematically illustrating a network node 2400, e.g. an access point, according to an embodiment. The network node comprises an antenna arrangement 2402, a receiver 2404 connected to the antenna arrangement 2402, a transmitter 2406 connected to the antenna arrangement 2402, a processing element 2408 which may comprise one or more circuits, one or more input interfaces 2410 and one or more output interfaces 2412. The interfaces 2410, 2412 can be operator interfaces and/or signal interfaces, e.g. electrical or optical. The network node 2400 is arranged to operate in a cellular communication network. In particular, by the processing element 2408 being arranged to perform the features demonstrated above, e.g. with reference to FIG. 13 and optionally FIG. 14, the network node 2400 is capable of efficiently providing WUPs and be implemented with low complexity. The processing element 2408 can also fulfil a multitude of tasks, ranging from signal processing to enable reception and transmission since it is connected to the receiver 2404 and transmitter 2406, executing applications, controlling the interfaces 2410, 2412, etc.

Figure 25:
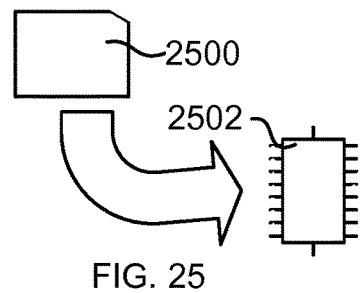
FIG. 25 schematically illustrates a computer-readable medium and a processing device.

The methods according to the present disclosure is suitable for implementation with aid of processing means, such as computers and/or processors, especially for the case where the processing element 2408 demonstrated above comprises a processor handling WUP provision. Therefore, there is provided computer programs, comprising instructions arranged to cause the processing means, processor, or computer to perform the steps of any of the methods according to any of the features described above, e.g. with reference to FIG. 13 and/or FIG. 14. The computer programs preferably comprise program code which is stored on a computer readable medium 2500, as illustrated in FIG. 25, which can be loaded and executed by a processing means, processor, or computer 2502 to cause it to perform the methods, respectively, according to embodiments of the present disclosure, preferably as any of the features described above, e.g. with reference to FIG. 13 and/or FIG. 14. The computer 2502 and computer program product 2500 can be arranged to execute the program code sequentially where actions of the any of the methods are performed stepwise or perform the methods on a real-time basis. The processing means, processor, or computer 2502 is preferably what normally is referred to as an embedded system. Thus, the depicted computer readable medium 2500 and computer 2502 in FIG. 25 should be construed to be for illustrative purposes only to provide understanding of the principle, and not to be construed as any direct illustration of the elements.

The invention claimed is:

1. A method comprising:
   selecting, from between first and second sets of complex-valued frequency domain symbols for an ON waveform, a set of complex-valued frequency domain symbols to provide to an inverse fast Fourier transformer for an ON waveform of an On-Off Keying (OOK) signal, depending respectively on whether a binary value of information to be transmitted is a first value or a second value;
   providing, to the inverse fast Fourier transformer, the selected set of complex-valued frequency domain symbols for the ON waveform of the OOK signal;
   performing an inverse fast Fourier transform with the inverse fast Fourier transformer to form an orthogonal frequency division multiplex (OFDM) representation, including a cyclic prefix, of the OOK signal of the information to be transmitted, wherein the OOK signal comprises the ON waveform and an OFF waveform forming a pattern representing the information as a Manchester code; and
   transmitting the OFDM representation.

2. The method of claim 1, wherein the first and second sets of complex-valued frequency domains symbols for an ON waveform are determined by:
   transforming a desired pattern representing the first value;
   selecting the first set of complex-valued frequency domain symbols as a set of complex-valued frequency domain symbols resembling the transformed desired pattern representing the first value;
   transforming an other desired pattern representing the second value; and
   selecting the second set of complex-valued frequency domain symbols as a set of complex-valued frequency domain symbols resembling the transformed other desired pattern representing the second value.

3. The method of claim 2, wherein the selecting of the first and second sets of complex-valued frequency domain symbols comprises adapting the selection of the complex-valued frequency domain symbols such that a magnitude of a difference in signal energy of the OFDM representation below a centre frequency of the OFDM representation and a signal energy of the OFDM representation above the centre frequency of the OFDM representation is below a threshold to achieve power spectrum flattening by the respective sets.

4. The method of claim 2, wherein the selection of the complex-valued frequency domain symbols comprises constraining selection such that symbols of each pair of frequency domain symbols with equal frequency offset to a centre frequency for the OFDM representation have equal magnitude.

5. The method of claim 1, wherein a complex symbol corresponds to a quadrature amplitude modulated (QAM) symbol.

6. The method of claim 1, wherein the pattern representing the information as a Manchester code is such that the transmitted power of an ON part exceeds the transmitted power of an OFF part.

7. The method of claim 1, wherein a first subset of available subcarriers is populated by an applied set of symbols and at least a second subset of available subcarriers is usable for data transmission.

8. The method of claim 7, where the Manchester coded OOK signal comprises a repetition coding, and wherein the method comprises selecting a length of the cyclic prefix such that a duration of the OFDM representation and the cyclic prefix matches the duration of the Manchester and repetition coded OOK signal.

9. The method of claim 8, wherein the OFDM representation is 12.8 µs and the cyclic prefix is selected to be 3.2 µs.

10. The method of claim 7, wherein a set of complex-valued frequency domain symbols populates 48 subcarriers of the OFDM representation, and corresponds to a 256 QAM symbol, wherein the first set of complex-valued frequency domain symbols provides the following complex values for the respective subcarrier:

| subcarrier | complex value |
| --- | --- |
| −24 | −5 + 1i |
| −23 | 7 − 5i |
| −22 | −5 + 5i |
| −21 | 5 − 7i |
| −20 | −5 + 9i |
| −19 | 3 − 9i |
| −18 | −3 + 13i |
| −17 | 3 − 9i |
| −16 | 3 + 15i |
| −15 | 1 − 9i |
| −14 | 7 + 15i |
| −13 | −1 − 9i |
| −12 | 11 + 11i |
| −11 | −1 − 9i |
| −10 | 15 + 7i |
| −9 | −1 − 9i |
| −8 | 15 + 3i |
| −7 | −3 − 11i |
| −6 | 15 − 3i |
| −5 | −3 − 11i |
| −4 | 11 − 7i |
| −3 | −5− 11i |
| −2 | 5 − 9i |
| −1 | −7 − 11i |
| 0 | 1 − 9i |
| 1 | −9 − 11i |
| 2 | −5 − 7i |
| 3 | −13 − 9i |
| 4 | −7 − 3i |
| 5 | −13 − 7i |
| 6 | −9 + 3i |
| 7 | −15 − 3i |
| 8 | −7 + 7i |
| 9 | −15 + 1i |
| 10 | −3 + 11i |
| 11 | −13 + 3i |
| 12 | 1 + 13i |
| 13 | −11 + 7i |
| 14 | 5 + 11i |
| 15 | −7 + 9i |
| 16 | 9 + 9i |
| 17 | −3 + 9i |
| 18 | 9 + 5i |
| 19 | 1 + 9i |
| 20 | 9 + 1i |
| 21 | 3 + 7i |

-continued

| subcarrier | complex value |
| --- | --- |
| 22 | 7 − 3i |
| 23 | 7 + 5i | which provides an OFF-ON-OFF-ON pattern, and
the second set of complex-valued frequency domain symbols provides the following complex values for the respective subcarrier:

| subcarrier | complex value |
| --- | --- |
| −24 | 1 − 5i |
| −23 | −9 − 1i |
| −22 | −3 + 7i |
| −21 | 7 + 5i |
| −20 | 7 − 7i |
| −19 | −5 − 9i |
| −18 | −11 + 5i |
| −17 | −1 + 9i |
| −16 | 15 − 1i |
| −15 | 5 − 9i |
| −14 | −15 − 5i |
| −13 | −9 + 3i |
| −12 | 11 + 11i |
| −11 | 9 + 3i |
| −10 | −7 − 15i |
| −9 | −7 − 7i |
| −8 | −1 + 15i |
| −7 | 1 + 11i |
| −6 | 5 − 13i |
| −5 | 7 − 9i |
| −4 | −9 + 9i |
| −3 | −11 + 5i |
| −2 | 9 − 5i |
| −1 | 13 + 3i |
| 0 | −9 + 3i |
| 1 | −9 − 11i |
| 2 | 7 − 1i |
| 3 | 3 + 15i |
| 4 | −7 + 1i |
| 5 | 5 − 15i |
| 6 | 9 − 1i |
| 7 | −11 + 11i |
| 8 | −9 − 1i |
| 9 | 15 − 3i |
| 10 | 11 + 5i |
| 11 | −13 − 3i |
| 12 | −9 − 9i |
| 13 | 11 + 7i |
| 14 | 5 + 11i |
| 15 | −5 − 11i |
| 16 | −1 − 11i |
| 17 | 1 + 11i |
| 18 | −3 + 11i |
| 19 | 1 − 9i |
| 20 | 5 − 7i |
| 21 | −3 + 7i |
| 22 | −5 + 3i |
| 23 | 5 − 5i | which provides an ON-OFF-ON-OFF pattern, and
where i indicates quadrature and the numbers represent a relative position in a signal constellation of the 256 QAM symbol.

11. The method of claim 7, wherein said providing comprises providing the selected set of complex-valued frequency domain symbols for the ON waveform of the OOK signal to the inverse faster Fourier transformer for populating the first subset of available subcarriers, and wherein said performing comprises populating the first subset of available subcarriers with the selected set of complex-valued frequency domain symbols.

12. The method of claim 1, wherein a subset of available subcarriers is populated by an applied set of symbols and other available subcarriers are nulled.

13. The method of claim 12, wherein a set of complex-valued frequency domain symbols populates 12 subcarriers of the OFDM representation, and corresponds to a 256 QAM symbol, wherein a null, 0+i0, is provided for populating at least one subcarrier, wherein the first set of complex-valued frequency domain symbols provides the following complex values for the respective subcarrier:

| subcarrier | complex value |
| --- | --- |
| −6 | −5 − 5i |
| −5 | −11 + 5i |
| −4 | −3 + 15i |
| −3 | 13 + 13i |
| −2 | 15 − 3i |
| −1 | 3 − 9i |
| 0 | 0 |
| 1 | 9 − 3i |
| 2 | 3 − 15i |
| 3 | −13 − 13i |
| 4 | −15 + 3i |
| 5 | −5 + 11i |
| 6 | 5 + 5i | and the second set of complex-valued frequency domain symbols provides the following complex values for the respective subcarrier:

| subcarrier | complex value |
| --- | --- |
| −6 | 5 − 5i |
| −5 | −5 + 11i |
| −4 | −3 − 15i |
| −3 | 13 + 13i |
| −2 | −15 − 3i |
| −1 | 9 − 3i |
| 0 | 0 |
| 1 | −3 + 9i |
| 2 | −3 − 15i |
| 3 | 13 + 13i |
| 4 | −15 − 3i |
| 5 | 11 − 5i |
| 6 | −5 + 5i | where i indicates quadrature and the numbers represent a relative position in a signal constellation of the 256 QAM symbol.

14. A transmitter comprising:
an inverse fast Fourier transformer; and
a transmitter circuit;
wherein the transmitter is configured to:
select, from between first and second sets of complex-valued frequency domain symbols for an ON waveform, a set of complex-valued frequency domain symbols to provide to the inverse fast Fourier transformer for an ON waveform of an On-Off Keying (OOK) signal, depending respectively on whether a binary value of information to be transmitted is a first value or a second value;
provide, to the inverse fast Fourier transformer, the selected set of complex-valued frequency domain symbols for the ON waveform of the OOK signal;
wherein the inverse fast Fourier transformer is configured to perform an inverse fast Fourier transform to form an orthogonal frequency division multiplex (OFDM) representation, including a cyclic prefix, of the OOK signal of the information to be transmitted, wherein the OOK signal comprises the ON waveform and an OFF waveform forming a pattern representing the information as a Manchester code
wherein the transmitter circuit is configured to transmit the OFDM representation.

15. The transmitter of claim 14, wherein the first and second sets of complex-valued frequency domain symbols for an ON waveform are such that the first set of complex-valued frequency domain symbols is a symbol set resembling a transform of a desired pattern representing the first value, and the second set of complex-valued frequency domain symbols is a symbol set resembling a transform of an other desired pattern representing the second value.

16. The transmitter of claim 15, wherein the first and second sets are adapted such that a magnitude of a difference in signal energy of the OFDM representation below a centre frequency of the OFDM representation and a signal energy of the OFDM representation above the centre frequency of the OFDM representation is below a threshold to achieve power spectrum flattening.

17. The transmitter of claim 15, wherein the complex-valued frequency domain symbols are constrained such that symbols of each pair of frequency domain symbols with equal frequency offset to a centre frequency for the OFDM representation have equal magnitude.

18. The transmitter of claim 14, wherein a complex symbol corresponds to a quadrature amplitude modulated (QAM) symbol.

19. The transmitter of claim 14, wherein the pattern representing the information as a Manchester code is such that the transmitted power of an ON part exceeds the transmitted power of an OFF part.

20. The transmitter of claim 14, wherein a first subset of available subcarriers is populated by an applied set of symbols and at least a second subset of available subcarriers is usable for data transmission.

21. The transmitter of claim 20 where the Manchester coded OOK signal comprises a repetition coding, and a length of the cyclic prefix is such that a duration of the OFDM representation and the cyclic prefix matches the duration of the Manchester and repetition coded OOK signal.

22. The transmitter of claim 21, wherein the OFDM representation is 12.8 µs and the cyclic prefix is selected to be 3.2 µs.

23. The transmitter of claim 20, wherein a set of complex-valued frequency domain symbols populates 48 subcarriers of the OFDM representation, and corresponds to a 256 QAM symbol, wherein the first set of complex-valued frequency domain symbols provides the following complex values for the respective subcarrier:

| subcarrier | complex value |
| --- | --- |
| −24 | −1 + 5i |
| −23 | 7 − 7i |
| −22 | 3 + 9i |
| −21 | −3 − 9i |
| −20 | 11 + 3i |
| −19 | −11 − 1i |
| −18 | 11 − 7i |
| −17 | −7 + 11i |
| −16 | 1 − 13i |
| −15 | 5 + 13i |
| −14 | −11 − 7i |
| −13 | 15 + 5i |
| −12 | −13 + 7i |
| −11 | 11 − 7i |
| −10 | −1 + 15i |
| −9 | 1 − 11i |
| −8 | 11 + 11i |
| −7 | −5 − 3i |
| −6 | 15 + 1i |
| −5 | −3 + 5i |
| −4 | 11 − 9i |
| −3 | 5 + 5i |
| −2 | 5 − 11i |
| −1 | 9 − 1i |
| 0 | 1 − 9i |
| 1 | 7 − 7i |
| 2 | −1 − 9i |
| 3 | 3 − 9i |
| 4 | −3 − 9i |
| 5 | −1 − 9i |
| 6 | −7 − 7i |
| 7 | −3 − 11i |
| 8 | −9 − 3i |
| 9 | −9 − 9i |
| 10 | −7 + 1i |
| 11 | −15 − 5i |
| 12 | −3 + 1i |
| 13 | −15 + 5i |
| 14 | −5 − 1i |
| 15 | −9 + 11i |
| 16 | −7 + 1i |
| 17 | −1 + 11i |
| 18 | −7 + 7i |
| 19 | 1 + 7i |
| 20 | −3 + 11i |
| 21 | 1 + 5i |
| 22 | 3 + 7i |
| 23 | 1 + 7i | which provides an OFF-ON-OFF-ON pattern, and the second set of complex-valued frequency domain symbols provides the following complex values for the respective subcarrier:

| subcarrier | complex value |
| --- | --- |
| −24 | −1 + 5i |
| −23 | 7 − 7i |
| −22 | 3 + 9i |
| −21 | −3 − 9i |
| −20 | 11 + 3i |
| −19 | −11 − 1i |
| −18 | 11 − 7i |
| −17 | −7 + 11i |
| −16 | 1 − 13i |
| −15 | 5 + 13i |
| −14 | −11 − 7i |
| −13 | 15 + 5i |
| −12 | −13 + 7i |
| −11 | 11 − 7i |
| −10 | −1 + 15i |
| −9 | 1 − 11i |
| −8 | 11 + 11i |
| −7 | −5 − 3i |
| −6 | 15 + 1i |
| −5 | −3 + 5i |
| −4 | 11 − 9i |
| −3 | 5 + 5i |
| −2 | 5 − 11i |
| −1 | 9 − 1i |
| 0 | 1 − 9i |
| 1 | 7 − 7i |
| 2 | −1 − 9i |
| 3 | 3 − 9i |
| 4 | −3 − 9i |
| 5 | −1 − 9i |
| 6 | −7 − 7i |
| 7 | −3 − 11i |

-continued

| subcarrier | complex value |
|---|---|
| 8 | −9 − 3i |
| 9 | −9 − 9i |
| 10 | −7 + 1i |
| 11 | −15 − 5i |
| 12 | −3 + 1i |
| 13 | −15 + 5i |
| 14 | −5 − 1i |
| 15 | −9 + 11i |
| 16 | −7 + 1i |
| 17 | −1 + 11i |
| 18 | −7 + 7i |
| 19 | 1 + 7i |
| 20 | −3 + 11i |
| 21 | 1 + 5i |
| 22 | 3 + 7i |
| 23 | 1 + 7i | which provides an ON-OFF-ON-OFF pattern, and
where i indicates quadrature and the numbers represent a relative position in a signal constellation of the 256 QAM symbol.

24. The transmitter of claim 14, wherein a subset of available subcarriers is populated by an applied set of symbols and other available subcarriers are nulled.

25. The transmitter of claim 24, wherein a set of complex-valued frequency domain symbols populates 12 subcarriers of the OFDM representation, and corresponds to a 256 QAM symbol, wherein a null, 0+i0, is provided for populating at least one subcarrier, wherein the first set of complex-valued frequency domain symbols provides the following values for the respective subcarrier:

| subcarrier | complex value |
|---|---|
| −6 | −5 − 5i |
| −5 | −11 + 5i |
| −4 | −3 + 15i |
| −3 | 13 + 13i |
| −2 | 15 − 3i |
| −1 | 3 − 9i |
| 0 | 0 |
| 1 | 9 − 3i |
| 2 | 3 − 15i |
| 3 | −13 − 13i |
| 4 | −15 + 3i |
| 5 | −5 + 11i |
| 6 | 5 + 5i | and the second set of complex-valued frequency domain symbols provides the following values for the respective subcarrier:

| subcarrier | complex value |
|---|---|
| −6 | 5 − 5i |
| −5 | −5 + 11i |
| −4 | −3 − 15i |
| −3 | 13 + 13i |
| −2 | −15 − 3i |
| −1 | 9 − 3i |
| 0 | 0 |
| 1 | −3 + 9i |
| 2 | −3 − 15i |
| 3 | 13 + 13i |
| 4 | −15 − 3i |
| 5 | 11 − 5i |
| 6 | −5 + 5i | where i indicates quadrature and the numbers represents a relative position in a signal room of the 256 QAM symbol.

26. A non-transitory computer-readable storage medium on which is stored a computer program comprising instructions which, when executed on a processor of a communication apparatus, cause the communication apparatus to:
select, from between first and second sets of complex-valued frequency domain symbols for an ON waveform, a set of complex-valued frequency domain symbols to provide to an inverse fast Fourier transformer for an ON waveform of an On-Off Keying (OOK) signal, depending respectively on whether a binary value of information to be transmitted is a first value or a second value;
provide, to the inverse fast Fourier transformer, the selected set of complex-valued frequency domain symbols for the ON waveform of the OOK signal;
perform an inverse fast Fourier transform with the inverse fast Fourier transformer to form an orthogonal frequency division multiplex (OFDM) representation, including a cyclic prefix, of the OOK signal of the information to be transmitted, wherein the OOK signal comprises the ON waveform and an OFF waveform forming a pattern representing the information as a Manchester code; and
transmit the OFDM representation.

* * * * *